US012693356B2

(12) United States Patent
Yang et al.

(10) Patent No.: US 12,693,356 B2
(45) Date of Patent: Jul. 28, 2026

(54) HALF DRIVING MODE FOR DEGENERATE BIRDCAGE COILS AND LADDER COILS

(71) Applicant: Quality Electrodynamics, LLC, Mayfield Village, OH (US)

(72) Inventors: Xiaoyu Yang, Indiana, PA (US); Steven Tokar, Lyndhurst, OH (US); Tsinghua Zheng, Chesterland, OH (US); Labros Peptropoulos, Maple Grove, MN (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 187 days.

(21) Appl. No.: 18/632,368

(22) Filed: Apr. 11, 2024

(65) Prior Publication Data

US 2024/0345189 A1     Oct. 17, 2024

Related U.S. Application Data

(60) Provisional application No. 63/495,556, filed on Apr. 12, 2023.

(51) Int. Cl.
*G01R 33/34* (2006.01)
*G01R 33/36* (2006.01)

(52) U.S. Cl.
CPC ... *G01R 33/34076* (2013.01); *G01R 33/3607* (2013.01); *G01R 33/3621* (2013.01)

(58) Field of Classification Search
CPC .......... G01R 33/34076; G01R 33/3607; G01R 33/3621; G01R 33/3415; G01R 33/3678
See application file for complete search history.

(56) References Cited

U.S. PATENT DOCUMENTS

| | | | | |
|---|---|---|---|---|
| 4,692,705 A | 9/1987 | Hayes | | |
| 2003/0201775 A1* | 10/2003 | Boskamp | ......... | G01R 33/34046 |
| | | | | 324/309 |
| 2008/0265889 A1* | 10/2008 | Zhai | ................... | G01R 33/3415 |
| | | | | 324/318 |

OTHER PUBLICATIONS

Yazdanbakhsh. "Microstrip Butler Matrix Design and Realization for 7 T MRI" Magnetic Resonance in Medicine 66:270-280 (2011), published on Feb. 28, 2011.
Alagappan et al. "Degenerate Mode Band-Pass Birdcage Coil for Accelerated Parallel Excitation" Magnetic Resonance in Medicine 57:1148-1158 (2007), published on May 29, 2007.

* cited by examiner

*Primary Examiner* — G.M. A Hyder
(74) *Attorney, Agent, or Firm* — Eschweiler & Potashnik, LLC

(57) ABSTRACT

A magnetic resonance imaging (MRI) system can include a magnetic resonance imaging (MRI) radio frequency (RF) coil, which is or otherwise includes a degenerate birdcage coil (DBC) or a ladder coil. The MRI RF coil includes a row of meshes for operation in a half driving transmit mode. The meshes can include driving meshes and non-driving meshes, where each non-driving mesh is coupled between neighboring driving meshes. Driving meshes are electrically coupled to drivers, whereas non-driving meshes are not. The MRI RF coil may have enhanced transmit power efficiency and magnetic field uniformity with fewer drivers.

20 Claims, 11 Drawing Sheets

1100

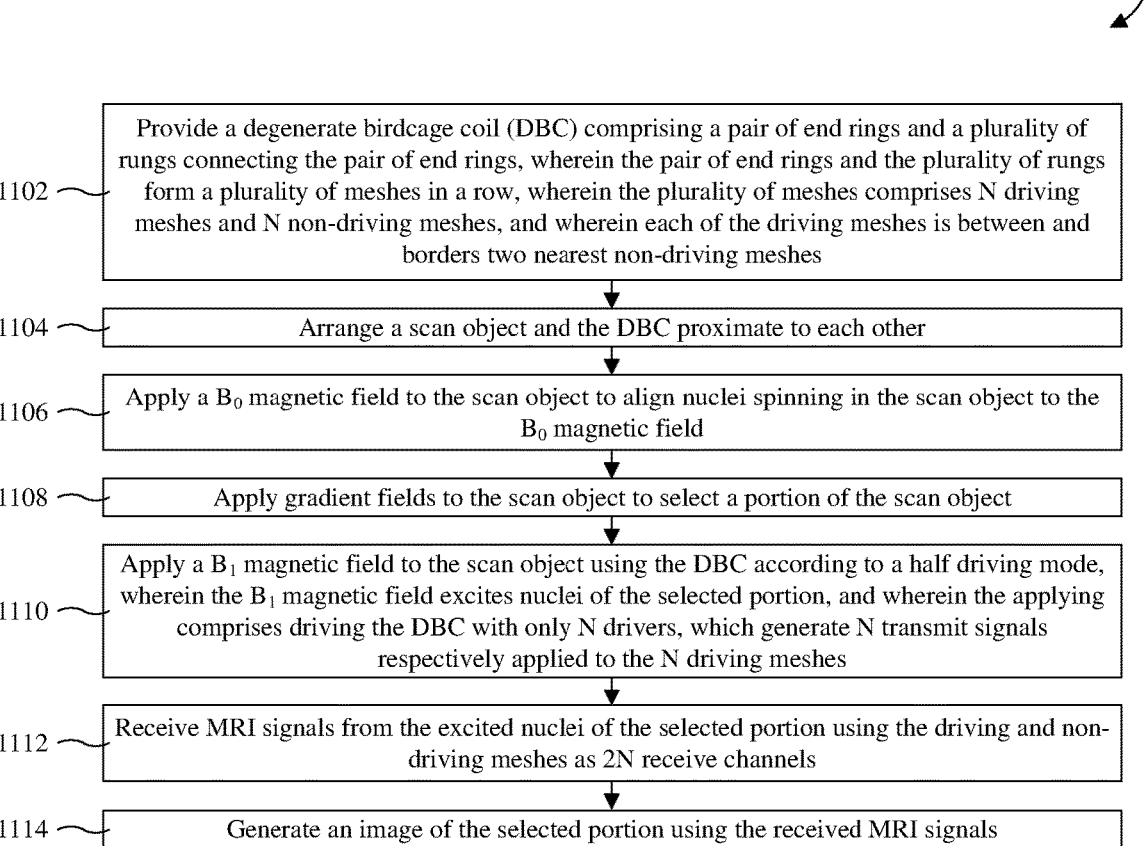

1102 — Provide a degenerate birdcage coil (DBC) comprising a pair of end rings and a plurality of rungs connecting the pair of end rings, wherein the pair of end rings and the plurality of rungs form a plurality of meshes in a row, wherein the plurality of meshes comprises N driving meshes and N non-driving meshes, and wherein each of the driving meshes is between and borders two nearest non-driving meshes 1104 — Arrange a scan object and the DBC proximate to each other 1106 — Apply a $B_0$ magnetic field to the scan object to align nuclei spinning in the scan object to the $B_0$ magnetic field 1108 — Apply gradient fields to the scan object to select a portion of the scan object 1110 — Apply a $B_1$ magnetic field to the scan object using the DBC according to a half driving mode, wherein the $B_1$ magnetic field excites nuclei of the selected portion, and wherein the applying comprises driving the DBC with only N drivers, which generate N transmit signals respectively applied to the N driving meshes 1112 — Receive MRI signals from the excited nuclei of the selected portion using the driving and non-driving meshes as 2N receive channels 1114 — Generate an image of the selected portion using the received MRI signals

Fig. 11

HALF DRIVING MODE FOR DEGENERATE BIRDCAGE COILS AND LADDER COILS

REFERENCE TO RELATED APPLICATIONS

This application claims the benefit of U.S. Provisional Application No. 63/495,556, filed Apr. 12, 2023, entitled "HALF DRIVING SCHEME FOR DEGENERATE BIRD-CAGE COILS AND LADDER COILS", the contents of which are herein incorporated by reference in their entirety.

BACKGROUND

Magnetic resonance imaging (MRI) involves the transmission and receipt of radio frequency (RF) energy. RF energy can be transmitted by an RF coil to create a $B_1$ field that rotates a net magnetization. Further, resulting magnetic resonance (MR) signals can be received by an RF coil to detect precessing transverse magnetization. Thus, RF coils can be transmit (Tx) coils, receive (Rx) coils, or transmit and receive (Tx/Rx) coils.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features can be arbitrarily increased or reduced for clarity of discussion. It is further noted that the examples portrayed in the figures should not be considered as the only embodiments or aspects covered by the present disclosure.

FIG. 11 illustrates a block diagram of some embodiments of a method for MRI using a half driving mode with a 2N-rung DBC or ladder coil.

DETAILED DESCRIPTION

Figure 1A:
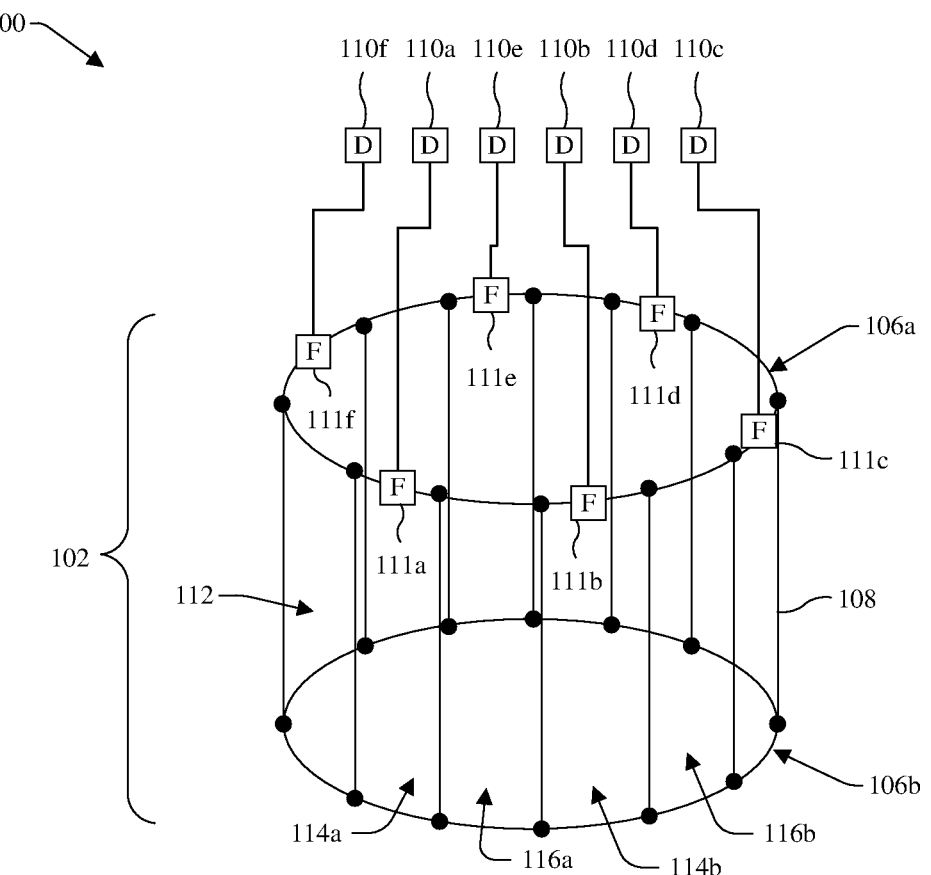
FIGS. 1A and 1B illustrate some embodiments of a 2N-rung degenerate birdcage coil (DBC) configured for a half driving mode.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows can include embodiments in which the first and second features are formed in direct contact, and can also include embodiments in which additional features can be formed between the first and second features, such that the first and second features can not be in direct contact. In addition, the present disclosure can repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

A birdcage coil (BC) is used as a transmit (Tx) coil in magnetic resonance imaging (MRI) systems. The BC can be structured according to three main configuration types, depending on how capacitors are positioned at the BC end rings and/or the BC rungs. These three types include high pass, low pass, and a band pass. For all three types, a uniform mode of the BC is typically tuned to a working frequency (e.g., a Larmor frequency) because MRI imaging depends on having a uniform transmitting (Tx) magnetic field (e.g., Tx $B_1+$ field). Further, to achieve this uniform mode of operation, other non-uniform mode frequencies are configured to be reasonably distant from the working frequency so that their contributions at the working frequency become trivial or do not significantly affect the working frequency.

A type of BC is the degenerate birdcage coil (DBC). The DBC includes capacitors on both ring and rung portions of the BC. Values of these capacitors are adjusted so all resonant modes, except the ring mode, collapse at the working frequency. Hence, both uniform mode and non-uniform modes operate at the same working frequency. When this happens, each mesh of the DBC can be considered as an independent radio frequency (RF) coil element or channel. A DBC has high transmit efficiency with good Tx magnetic field ($B_1+$) uniformity.

The DBC can be used in parallel transmission (pTx) applications, for example, at 3 Tesla (T) and above. A pTx MRI RF coil enables each transmit channel of the coil to generate its own magnitude and phase field to enhance Tx magnetic field ($B_1+$) uniformity at the targeted imaging area. Compared to other pTx coils, such as those in which each channel is a loop, the DBC is more power efficient because the shared rung current between two adjacent meshes is smaller than the ring current in many driving cases/in a transmit mode of operation.

Using more rungs in a birdcage coil normally gives better performance. For example, a 16-rung DBC may have better Tx magnetic field uniformity (e.g., $B_1+$ uniformity) and power efficiency than an 8-rung DBC in a circular polarized (CP) mode or a Quadrature (QD) mode. More rungs can have higher Tx power efficiency due to less current on each rung at the same $B_1$+ field. Less current on rungs of the DBC not only generates less resistive loss, but also less radiation loss. Note that this radiation loss becomes larger when the working frequency is higher (e.g., at 7 T or more). Further, more rungs also have a better uniformity in a CP mode. The CP mode refers to each loop or mesh having a same current magnitude (I) and the adjacent loops/meshes have a phase difference (e.g., a 45-degree phase differential in an 8-mesh coil) in a clockwise/counterclockwise direction depending on the CP direction.

While more rungs (and hence more meshes) may lead to better performance, more rungs may also lead to higher costs for pTx applications. In particular, a DBC normally depends on a pTx driver for each mesh of the DBC. For example, a 16-rung DBC may depend on 16 pTx drivers, whereas an 8-rung DBC may depend on 8 pTx drivers. Because each pTx driver can be expensive, a large cost difference may exist between a 16-channel pTx driver system and an 8-channel pTx driver system. Therefore, a total cost of a pTx driver system increases when the pTx driver number increases. Practical implementation of a DBC for MRI then involves a tradeoff between cost and performance, which is not ideal.

Various aspects of the present disclosure are directed towards a 2N-rung DBC or ladder coil using an enhanced pTx driving mode, hereafter referred to as a half driving mode. The half driving mode reduces a number of pTx drivers. For example, the half driving mode may use only N pTx drivers to drive a 2N-rung DBC or ladder coil, where N is an integer of two or greater. By reducing the number of pTx drivers, the half driving mode reduces costs. Further, the half driving mode increases Tx power efficiency and magnetic field uniformity compared to an N-rung DBC in a full driving mode.

As seen hereafter, the reduction in pTx drivers and the enhancement in performance is achieved without use of a Butler matrix. A Butler matrix has 2N inputs and 2N outputs. The 2N outputs are coupled to meshes of a 2N-rung DBC, and N inputs are coupled to N pTx drivers. Hence, a Butler matrix allows a 50% reduction in pTx drivers. However, designing and producing a Butler matrix for an 8-rung or 16-rung DBC can be difficult. Further, a Butler matrix may be dependent on three or four stage hardware, where each stage introduces power efficiency loss. Thus, the Butler matrix approach can introduce a non-trivial power efficiency loss before the Tx power is applied to the coil.

In an aspect, a DBC can comprise two times N (or 2N) rungs elongated in parallel between two end rings to form 2N meshes (e.g., coil elements/channels). N can be an integer of two or more (e.g., 2, 4, 8, or some other suitable integer greater than 2). According to the half driving mode, the meshes include N driving meshes and N non-driving meshes. Each driving mesh can be electrically coupled to a pTx driver that provides a current directly to passive elements of the driving mesh. Each non-driving mesh is devoid of a pTx driver and can be between a corresponding pair of neighboring driving meshes.

A total number of pTx drivers (e.g., N) is less than a total number of rungs (e.g., 2N) and hence a total number of meshes (e.g., 2N), and is equal to a total number of driving meshes (e.g., N). For example, where N is 6, the DBC can include 3 driving meshes, 3 non-driving meshes, and 3 pTx drivers electrically coupled respectively to the 3 driving meshes. Each of the 3 pTx drivers can operate independently to provide current to an associated driving mesh independently from other meshes for driving the DBC in a half driving mode.

In another aspect, a 2N-rung ladder coil can comprise two times N (or 2N) rungs elongated in parallel between two legs to form 2N−1 meshes (e.g., coil elements/channels). According to the half driving mode, the meshes include N driving meshes and N−1 non-driving meshes. Each driving mesh can be electrically coupled to a pTx driver that provides a current directly to passive elements of the driving mesh. Each non-driving mesh is devoid of a pTx driver and can be between a corresponding pair of neighboring driving meshes. A total number of pTx drivers (e.g., N) is less than a total number of rungs (e.g., 2N) and a total number of meshes (e.g., 2N), and is equal to a total number of driving meshes (e.g., N).

The half driving mode of a 2N-rung DBC or a ladder coil can be utilized for 3 T pTx application or above, for example. Using the 2N-rung DBC or a ladder coil with the half driving mode can be more power efficient and achieve a higher magnetic field uniformity than using an N-rung DBC or ladder coil in a full driving mode because of the higher number of rungs. Further, these benefits may be achieved using the same number of pTx drivers, or a similar number of pTx drivers, as the N-rung DBC or ladder coil. As seen hereafter, the full driving mode has a separate pTx driver for each mesh and all meshes are driving meshes.

Additionally, the half driving mode of a 2N-rung DBC or ladder coil can be safer than other configurations (e.g., an N-rung DBC or ladder coil) since power is not only expensive but is also safety related. In particular, MRI RF coils (e.g., the 2N-rung DBC or ladder coil) are subject to pass a root mean square (RMS) power test under a pre-defined $B_1$ value to meet safety regulations. If an RF coil is not Tx efficient, the RF coil demands more power to achieve the same $B_1$ value and the extra Tx power causes the coil temperature to be higher. Because there is a stringent safety regulation regarding temperature, a higher coil temperature could fail regulatory requirements. Thus, a Tx efficient coil is more desirable.

Being that the 2N-rung DBC is degenerate, each mesh of the 2N-rung DBC may operate independent of each other mesh. In other words, the current magnitude and current phase at each mesh can be independently controlled. A uniform mode of operation refers to all currents on the rungs having the same magnitude and different phases distributed uniformly from 0 to 360. Because each mesh of the 2N-rung DBC can be independently operated, the 2N-rung DBC may be operated in the uniform mode. Hence, the uniform mode may be regarded as a special case or a sub-mode of the degenerate mode that the 2N-rung DBC operates in.

Whether the ladder coil is degenerate may depend at least partially on a layout of the ladder coil. For example, if the ladder coil is flat or slightly curved, then the couplings among non-direct neighbor coils are small. Hence, the ladder coil may be degenerate. However, if the ladder coil is folded, the couplings between non-direct neighbor coils may be large. Hence, a degenerate mode of operation may be precluded.

The 2N-rung DBC or ladder coil can, for example, be used as a system built-in whole-body coil (WBC) or as a local coil. The local coil can, for example, be a head coil, a knee coil, a wrist coil, or the like. Further, the 2N-rung DBC or ladder coil can, for example, be used for field strengths ranging from very low frequency, such as less than 0.1 T, to very high frequency, such as 7 T or above, for example.

Additionally, the 2N-rung DBC or ladder coil can comprise multiple rows, including a first row and a second row. The first row can have 2N-rungs driven according to the half drive mode and the second row can have 2N-rungs driven according to the half drive mode. Further, the first and second rows may share a common set of N pTx drivers. Alternatively, the second row may have a different set of N pTx drivers than the first row. Further, the second row can have a different number of rungs than the first row and/or can be driven according to the full drive mode or some other suitable drive mode.

In an aspect, each pTx driver can be connected to a power splitter, which is electrically coupled to multiple mesh in different rows. For example, each pTx driver may be electrically coupled to a 2-to-1 power splitter, which may be electrically coupled to a mesh in the first row and a mesh in the second row. In the case of a DBC or ladder coil comprising two rows of sixteen rungs each, the 2-to-1 power splitter may allow 8 pTx drivers to drive the whole coil in the half drive mode. Further, in a Rx mode, the coil can operate with 31 or 32 Rx channels depending on whether the coil is a ladder coil or a DBC.

In an aspect, the half driving mode allows the driving meshes to be a different size and/or have a different rung spacing than the non-driving meshes. For example, the rungs of the non-driving meshes can be closer to one another than the rungs of the driving meshes, which can contribute to an increase in magnetic field uniformity. Different mesh sizes and rung spacings enable different coil designs and provide flexibility for different target anatomies. In another aspect, the 2N-rung DBC or ladder coil can be coupled to transmit/receive (T/R) switches. Each driving mesh can be connected to a T/R switch in order to switch between a transmit mode and a receive mode. Further, the non-driving meshes can also be used as receivers.

The 2N-rung DBC or ladder coil can be used in 1 transmit or 2 transmit applications at 3 T or below by using power splitters, where up to two different transmit directions can be driven as two independent transmit channels. For example, at 3 T and lower, because a dielectric resonance of an anatomy is not as severe at higher field strengths, the coil generally operates at a uniform mode (e.g., tuned to a working frequency). The uniform mode has two independent directions, whereby the set of physical channels of the coil may be treated as two separate sets of logical channels (a set for each direction). The two sets of logical channels may be driven in a CP mode or may be driven separately from each other.

FIG. 1A illustrates a perspective view 100 of some aspects of a DBC MRI RF coil 102. The DBC MRI RF coil 102 includes an even number (e.g., 2*N or 2N) rungs forming meshes. Meshes can be also referred to as channels, loops, or RF coil elements. The DBC MRI RF coil 102 includes two end rings 106a, 106b (e.g., circular conductive loops) coupled to a plurality of rungs 108 (e.g., conductive straight elements) connecting the two end rings 106a, 106b. The number of rungs can vary depending on the type or size of the coil according to a particular anatomy being scanned. A greater number of rungs 108 (and hence meshes) results in a higher transmit power efficiency due to less current being on each rung at the same magnetic field, as well as less resistive loss and less radiation loss resulting.

The end rings 106a, 106b and the rungs 108 form a row of meshes 112 (e.g., RF coil elements, loops, or channels) in a cylindrical arrangement (e.g., circumferentially around an axis). Each mesh 112 is defined by corresponding portions of the two end rings 106a, 106b and two directly neighboring rungs. In the DBC MRI RF coil 102, each rung 108 is shared between two meshes 112. However, the DBC MRI RF coil 102 can also be configured as a ladder coil in which two rungs respectively on opposite ends of the ladder coil are not shared.

The row of meshes 112 forming the DBC MRI RF coil 102 includes driving meshes 114a, 114b, etc. (collectively or individually referred to with reference numeral "114") and non-driving meshes 116a, 116b, etc. (collectively or individually referred to with reference numeral "116"). The driving meshes 114 can be located at every other mesh 112, while the non-driving meshes can be located at every other alternate mesh 112. For example, a non-driving mesh 116a can be located between and connected to a pair of neighboring driving meshes 114a and 114b. However, other configurations of the row of meshes 112 are amenable.

In contrast to the non-driving meshes 116, the driving meshes 114 include or are otherwise electrically coupled to drivers (D) 110a, 110b, 110c, 110d, 110e, 110f (collectively or individually referred to with reference numeral "110"). The drivers 110 may, for example, be electrically coupled to the driving meshes 114 via feed boards (F) 111a, 111b, 111c, 111d, 111e, 111f (collectively or individually referred to with reference numeral "111") on end ring 106a. The feed boards 111 may, for example, include matching circuits and/or other circuitry to facilitate electrical coupling of the drivers 110 to the driving meshes 114.

Each driver 110 is electrically coupled to a driving mesh 114 for independently driving a current to power the corresponding mesh 112 in a transmit mode. Each driver 110 can include various circuit components or elements including software, hardware, or firmware in a combination of software and hardware for independently driving different driving meshes 114. For example, a driver 110 can include circuit elements for driving or powering a driving mesh 114 in the DBC MRI RF coil 102, along with any software corresponding to any digital components also. Such circuit elements may include, for example, one or more of: diodes, amplifiers, capacitors, inductors, transistors, etc. Further, the drivers 110 may be independent of each other or otherwise grouped into one or more driver systems or circuits. For example, half of the drivers 110 may belong to a first driver system or circuit, and a remainder of the drivers 110 may belong to a second driver system or circuit.

The non-driving meshes are not directly electrically coupled to any driver and are not independently driven. Hence, the DBC MRI RF coil 102 can be driven as a function of a half driving mode, where less than all of the meshes 112 forming independent channels or loops are being independently driven for transmit mode. This results in higher power efficiency, higher safety, and less radiation loss compared to driving a DBC MRI RF coil with N rungs.

In the half driving mode, the driving meshes 114 are independently driven and account for less than a total number of meshes of the DBC MRI RF coil 102. Further, the driving meshes 114 may have different sizes and/or rung spacings than the non-driving meshes 116. Alternatively, the driving meshes 114 and the non-driving meshes 116 may have the same size and/or rung spacing. By allowing different mesh sizes and/or rung spacings, the half driving mode provides design flexibility for different anatomical targets.

As suggested by its name, the DBC MRI RF coil 102 is configured to operate in a degenerate mode. The degenerate mode can allow the DBC MRI RF coil 102 to operate with increased transmit efficiency and with good isolation between meshes 112. To achieve the degenerate mode, the DBC MRI RF coil 102 has capacitors (not shown) on the two end rings 106a, 106b and on the plurality of rungs 108.

Further, the capacitors are tuned so all resonant modes of the DBC MRI RF coil 102 (except for a ring mode where there is no rung current flowing) collapse to the same frequency (e.g., a Larmor frequency for MRI).

Because the DBC MRI RF coil 102 operates in the degenerate mode, each mesh is isolated from each other mesh in the row. Therefore, the DBC MRI RF coil 102 can be utilized as a pTx coil and each mesh acts as one pTx channel. Further, each driving mesh can be driven via a feed board (e.g., being or including a matching circuit) at one ring side.

In some aspects, a shape of the row of meshes 112 is defined wholly or partially by a cylindrical former (not shown), which is a housing structure used to support and maintain the cylindrical arrangement of the DBC MRI RF coil 104. In some aspects, the DBC MRI RF coil 102 is a local coil in a cylindrical arrangement configured to surround a body part (e.g., head, arm, leg, etc.). In other aspects, the DBC MRI RF coil 104 is a WBC.

While the DBC MRI RF coil 102 is illustrated with one row, the DBC MRI RF coil 102 can alternatively include two or more rows of meshes 112. In such embodiments, the multiple rows circumferentially surround a cylindrical volume and are each driven in the half driving mode. For example, each row can include N driving meshes and N non-driving meshes alternating 1-to-1 circumferentially around the cylindrical volume. Further, in some embodiments, each row overlaps with each neighboring row along an axis of the cylindrical volume to reduce coupling with that neighboring row.

The meshes 112 can comprise conductive wire or strips (e.g., of copper or other conductive material) and can comprise various circuits and/or circuit elements, such as capacitors, inductors, diodes, etc. Further, each mesh 112 can have a same structure (e.g., in terms of size, circuitry, material, etc.), but is not limited thereto. In other aspects, some or all of the meshes 112 can have different structures (e.g., in terms of size, circuitry, material, etc.) from one another. In the perspective view 100 of FIG. 1A, the aforementioned circuits and circuit elements are not included for ease of illustration.

In some aspects, the meshes 112 can be used as Rx coil elements in an Rx mode of the DBC MRI RF coil 102. For example, the DBC MRI RF coil 102 can be used as a phased array Rx coil in which each mesh 112 corresponds to a channel. The Rx mode of operation can utilize low noise preamplifiers and/or T/R switches, which are not illustrated, for example. In other aspects, the driving meshes 114 can be used as Tx coil elements in a Tx mode of the DBC MRI RF coil 104. For example, each driving mesh 114 can be used as a pTx coil element. Thus, each driving mesh 114 in the row sends RF pulses to and/or each mesh 112 in the row receives RF pulses from the imaging volume during imaging by MRI.

In FIG. 1A, the row comprises twelve meshes 112. However, it will be appreciated that FIG. 1A is a non-limiting example. More or less meshes 112 (e.g., 8, 16, or some other suitable number) are amenable and hence more or less rungs are amenable. As noted above, the DBC MRI RF coil 102 can comprise 2N meshes and 2N rungs, where N is an integer of at least 2 or some other suitable value. Additionally, the DBC MRI RF coil 102 can also comprise various circuits and circuit elements (e.g., capacitors, diodes, and/or the like), which are not illustrated in the perspective view 100 of FIG. 1A for ease of illustration.

Figure 1B:
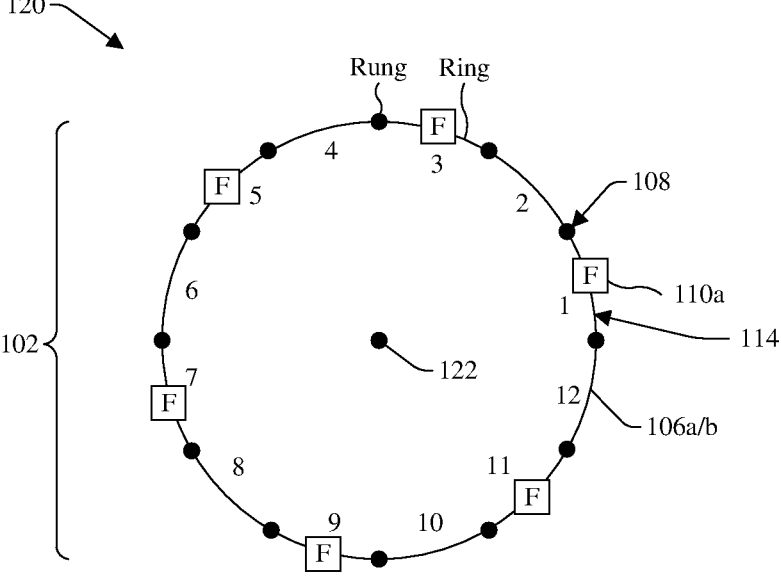

FIG. 1B illustrates an axial view 120 of an example of the DBC MRI RF coil 102 of FIG. 1A. The axial view 120 illustrates an axis 122 for a cylindrical shape of the DBC MRI RF coil 102. Note that the axis 122 is not illustrated in FIG. 1A for ease of illustration. Further, note that the rungs 108 overlap with the two end rings 106a, 106b and are emphasized by black circles. In some aspects, each mesh 112 (see, e.g., FIG. 1A) is spaced apart from the axis 122 by a same distance. However, depending on the configuration of the DBC MRI RF coil 102, this may not be the case. The distance and hence the shape of the coil could vary.

The driving meshes 114 are labeled with odd numbers but may alternatively be labeled with even numbers. Further, a driver 110 can be connected to each driving mesh 114. Each driver 110 can provide a separate current independently to a corresponding one the driving meshes 114, while non-driving meshes are not directly provided a current. The current can vary among the driving meshes 114, or can be the same, to drive the row of meshes 112 in the DBC MRI RF coil 102 at a working frequency for MRI in a half driving mode.

More rungs in the MRI RF coil can provide a better magnetic field uniformity in a CP mode. However, more rungs can demand more pTx drivers. For example, 16 pTx drivers could be utilized in a 16-rung DBC, which raises cost, such that a total cost of a pTx driver system increases as the pTx channel number increases. By utilizing a DBC MRI RF coil configured for a half driving mode, the number of pTx drivers can be reduced by at least 50% while realizing an increase in power efficiency and magnetic field uniformity.

Figure 2:
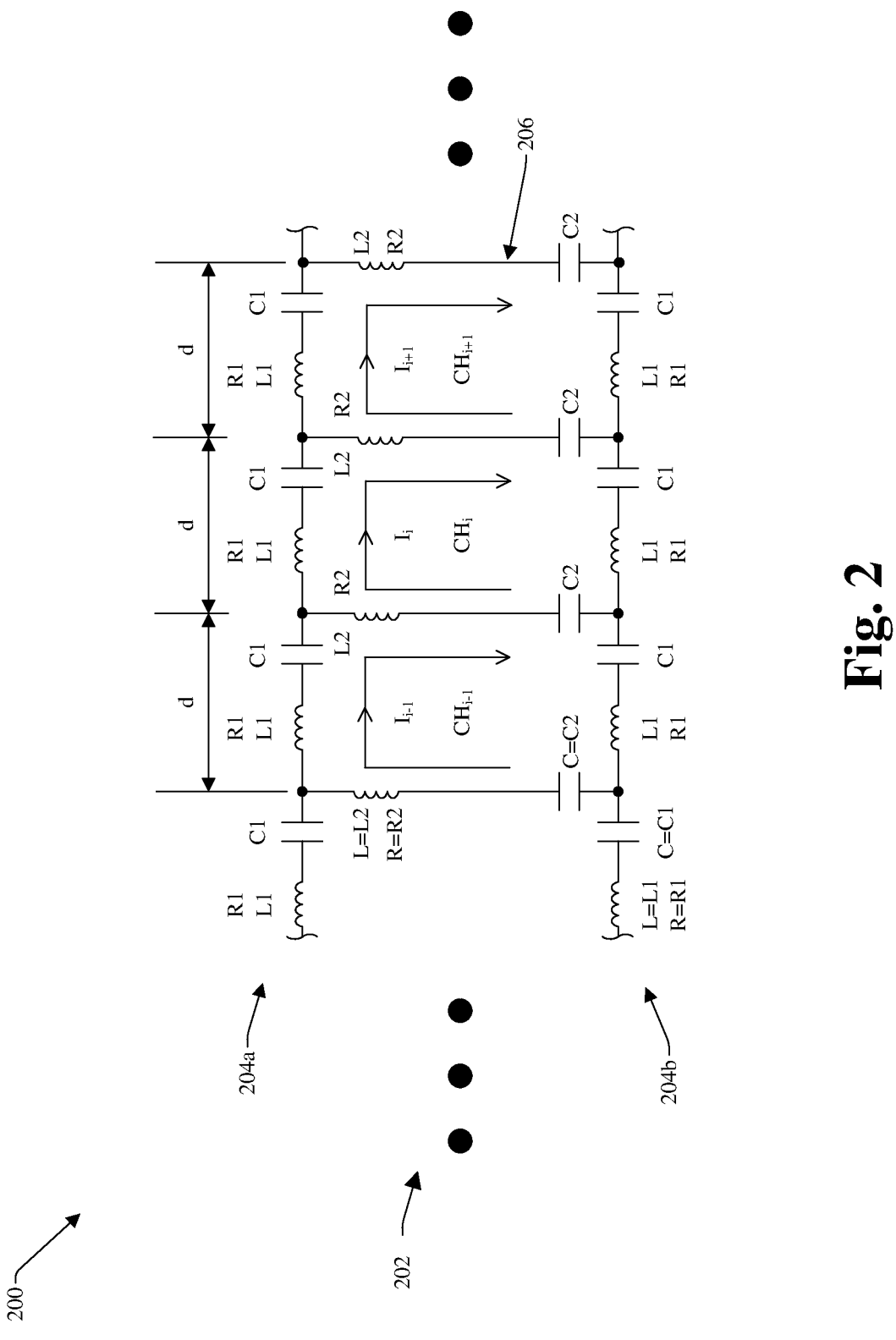
FIG. 2 illustrates some embodiments of a 2N-rung DBC.

FIG. 2 illustrates a partial view of a 2N-rung DBC 200 with a row 202 of meshes $CH_{i-1}$, $CH_i$, $CH_{i+1}$. i represents an integer index from 1 to 2N and may, for example, represent any mesh of the 2N-rung DBC 200. The 2N-rung DBC 200 is flattened and only partially shown for ease of illustration, but may, for example, be circumferentially arranged around a cylindrical former (e.g., as in FIG. 1B). Further, the 2N-rung DBC 200 can, for example, be employed in a Tx mode or an Rx mode, according to various aspects discussed herein.

The meshes $CH_{i-1}$, $CH_i$, $CH_{i+1}$ are the same as one another, have the same circuit elements (e.g., inductors L, capacitors C, and resistors R), have equal size d, and have equal rung spacing d. Further, each mesh $CH_{i-1}$, $CH_i$, $CH_{i+1}$ has two rungs shared respectively with two neighboring meshes. Although the 2N-rung DBC 200 illustrates three meshes $CH_{i-1}$, $CH_i$, $CH_{i+1}$ being driven, additional meshes are envisioned as shown by the ellipses.

End ring 204a comprises a ring inductor L1, a ring resistor R1, and a ring capacitor C1 at each mesh, and end ring 204b comprises a ring inductor L1, a ring resistor R1, and a ring capacitor C1 at each mesh. Further, each rung 206 comprises a rung inductor L2, a rung resistor R2, and a rung capacitor C2. During use of the 2N-rung DBC 200, each ring inductor L1 and its adjoining ring capacitor C1 resonate with each other at the working frequency (e.g., the Larmar frequency), whereby impedances of the ring inductor L1 and the ring capacitor C1 cancel out. Hence, end ring 204a has an impedance of R1 at each mesh and end ring 204b has an impedance of R1 at each mesh. Further, each rung inductor L2 and its adjoining rung capacitor C2 resonate with each other at the working frequency, whereby impedances of the rung inductor L2 and the rung capacitor C2 cancel out. Hence, each rung has an impedance of R2.

Applying Kirchhoff's law (e.g., the sum of potential differences around any closed loop is zero), results in equation (Eq.) 1 represented as follows:

$$(I_i - I_{i-1}) * R_2 + 2I_i * R_1 + (I_i - I_{i+1}) * R_2 = 0, \qquad \text{Eq. 1}$$

where currents $I_{i-1}$, $I_i$, and $I_{i+1}$ are associated with respective meshes $CH_{i-1}$, $CH_i$, $CH_{i+1}$. Further, after simplification, Eq. 1 can be represented as Eq. 2 as follows:

$$I_i = \frac{(I_{i-1} + I_{i+1})}{2\left(1 + \dfrac{R_1}{R_2}\right)} \qquad \text{Eq. 2}$$

In various aspects, the first end ring 204a (partially shown) is coupled to the second end ring 204b (partially shown) by 2N rungs 206 (partially shown). The 2N-rung DBC 200 can be configured according to various aspects herein as a DBC MRI RF coil. The meshes $CH_{i-1}$, $CH_i$, $CH_{i+1}$, etc. can be equal in size and/or rung spacing for operating in a half driving mode. The 2N rungs 206 are connected in a row to form a row of meshes. The 2N-rung DBC 200 can be used as a WBC, head coil, knee coil, hand/wrist coil, or any other cylindrical coil. The 2N-rung DBC 200 can be configured as one mechanical piece or multiple mechanical pieces coupled together around one or more anatomies or target anatomies for MRI.

While the present disclosure has thus far focused on a DBC, it is to be appreciated that aspects of the DBC are applicable to a ladder coil. A ladder coil has a similar structure as a DBC, except end rings connected by rungs are replaced with end legs connected by rungs. Further, two rungs respectively on opposite ends of the ladder coil are not shared with multiple meshes. The ladder coil can be flat, curved, U-shape, C-shape, etc.

Figure 3:
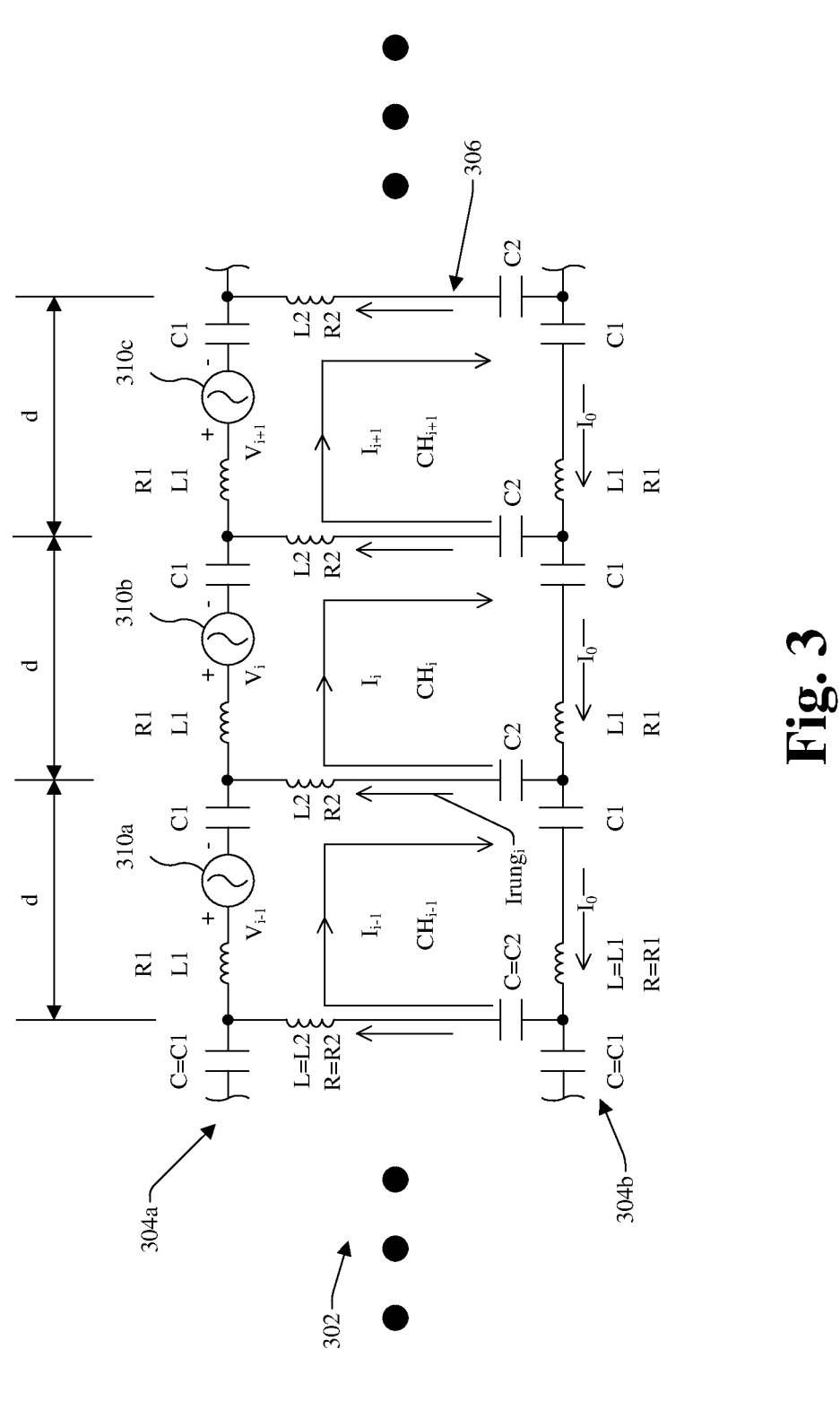
FIG. 3 illustrates some embodiments of a full driving mode of a 2N-rung DBC.
Figure 4:
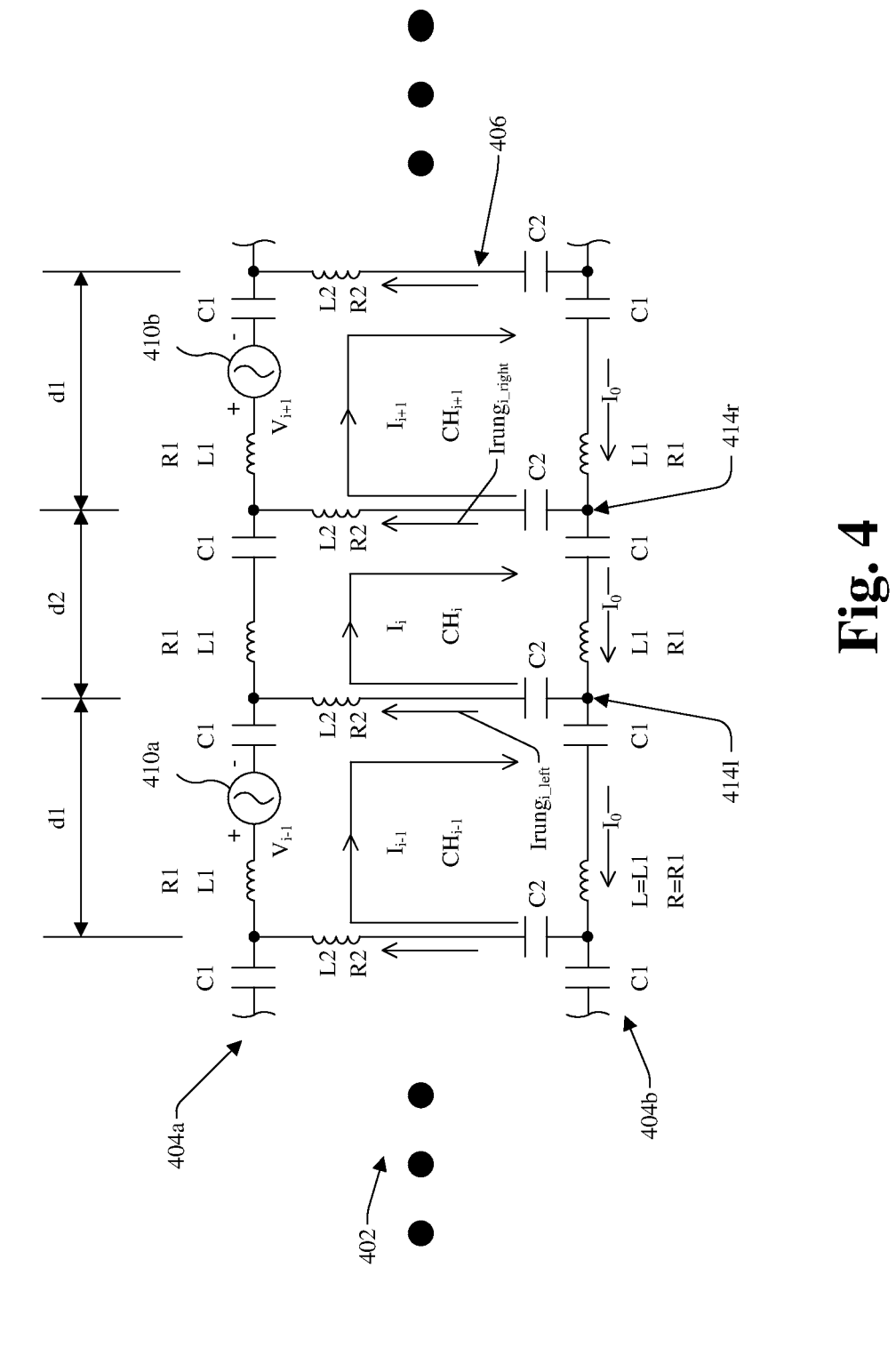
FIG. 4 illustrates some embodiments of a half driving mode of a 2N-rung DBC.

FIGS. 3 and 4 illustrate examples of different driving modes (e.g., CP or QD modes) in a 2N-rung DBC for a comparison of advantages with various aspects herein. In particular, FIG. 3 illustrates a full driving mode, whereas FIG. 4 illustrates a half driving mode. Further, as above the 2N-rung DBC is flattened for ease of illustration, but may, for example, be circumferentially arranged around a cylindrical former (e.g., as in FIG. 1B)

With regard to the full driving mode of FIG. 3, each mesh $CH_{i-1}$, $CH_i$, $CH_{i+1}$ is driven by a current source 310a, 310b, 310c. The current sources 310a, 310b, 310c correspond to individual drivers (not shown) and respectively provide currents $I_{i-1}$, $I_i$, $I_{i+1}$. A current at a mesh $CH_i$ may be represented by Eq. 3 as follows:

$$I_i = I_0 \text{Cos}\left(\omega_0 t + \frac{i}{2N} * 2\pi\right), \qquad \text{Eq. 3}$$

where $\omega_0$ is the angular working frequency (e.g., Larmor frequency), t is time, and $I_0$ is a ring current at end ring 304b. Further, the left rung current of mesh $CH_i$ can be written as in Eq. 4.

$$Irung_i = -2I_0 \text{Sin}\left(\frac{\pi}{2N}\right) \text{Sin}\left[\omega_0 t - \frac{\pi}{2N} \mp \frac{i}{2N} * 2\pi\right]. \qquad \text{Eq. 4}$$

The currents $I_0$ are individual to the ring sections of the meshes $CH_{i-1}$, $CH_i$, $CH_{i+1}$ and thus vary thereat. The currents at each rung are shared by the two directly neighboring meshes at that rung. Therefore, $I_0$ is used to represent current at the rings whereas subtraction is used to represent current at the rungs. As an example, Eq. 4 can be represented using a subtraction result of two instances of Eq. 3:

$$I_0 \text{Cos}\left(\omega_0 t + \frac{i}{2N} * 2\pi\right) - I_0 \text{Cos}\left(\omega_0 t + \frac{i-1}{2N} * 2\pi\right).$$

Each mesh in the row 302 of meshes $CH_{i-1}$, $CH_i$, $CH_{i+1}$ may be electrically coupled to a corresponding driver and may hence be regarded as a driving mesh. Further, as seen in Eq. 4 and recalling that i may correspond to any mesh, each mesh may have a rung current $Irung_i$ that is much smaller than the ring current $I_0$. For example, $Irung_i$ may only be about 39% of the ring current $I_0$, when N is 8 and hence the 2N-rung DBC is a 16-rung DBC.

The full driving mode generates a CP uniform $B_1+$ field. Applying Eq. 4 to the 2N-rung DBC 300, the $B_1+$ field can be estimated at the iso-center of the 2N-rung DBC 300 and the total coil power consumption for the full driving modes of both an N-rung DBC and the 2N-rung DBC 300 can be estimated. To estimate $B_1+$ field at the iso-center, contributions from end rings 304a and 304b can be ignored because these tend to cancel each other at the iso-center. Thus, a 2N-rung DBC can be considered as the sum of two N-rung birdcage coils with an azimuthal angle rotation of $$\frac{2\pi}{2N}$$

between them and a $$\frac{2\pi}{2N}$$

phase difference between them.

To compare an N-rung DBC and a 2N-rung DBC, both coils can be assumed to have the same diameter and length (d+d+d+ . . . ). Further, all rungs can be assumed as the same resistance R2, and all ring traces can be assumed as the same resistance R1. Further, the N-rung DBC ring loss can be assumed as R1 and the 2N-rung DBC ring loss can be assumed as 0.5*R1 (e.g., half of R1). Further, the generated $B_1+$ field value can be assumed as $B_1$ at the iso-center with a ring current $I_0$ for the N-rung DBC. With these assumptions in mind, rung current $I_{rung\_N}$, $B_1+$ field magnitude at the iso-center $B_{1+\_iso\_N}$, and total power consumption at unloaded conditions without radiation loss considered can be represented as follows in Eq. 5:

$$\begin{cases} I_{rung\_N} = -2I_0 \text{Sin}\left(\dfrac{\pi}{N}\right) \\ B_{1+\_iso\_N} = B_1 \\ \text{Unloaded total power}_N = 2N I_0^2 R_1 + N \left(2I_0 \text{Sin}\left(\dfrac{\pi}{N}\right)\right)^2 R_2 \end{cases} \qquad \text{Eq. 5}$$

For the 2N-rung birdcage, its rung current $I_{rung\_2N}$, $B_1+$ field magnitude at the iso-center $B_{1+\_iso\_2N}$, and total power consumption at unloaded conditions without radiation loss considered can be represented as follows in Eq. 6:

$$I_{rung\_2N} = -2I_0\mathrm{Sin}\left(\frac{\pi}{2N}\right) \qquad \text{Eq. 6}$$

$$B_{1+\_iso\_2N} = 2\,\frac{\mathrm{Sin}\left(\frac{\pi}{2N}\right)}{\mathrm{Sin}\left(\frac{\pi}{N}\right)}B_1$$

$$\text{Unloaded total power}_{2N} = 4N\,I_0^2\frac{R_1}{2} + 2N\left(2I_0\mathrm{Sin}\left(\frac{\pi}{2N}\right)\right)^2 R_2$$

Based on Eq. 5 and Eq. 6 above, the 2N-rung DBC $B_1+$ field magnitude at the iso-center is always slightly larger than an N-rung birdcage at the same ring current $I_0$. Regarding the power consumption, the first terms of both the N-rung and 2N-rung DBCs are the same. The second term of the 2N-rung DBC is about 50% of the N-rung DBC's. Therefore, the 2N-rung DBC can be observed to be more power efficient.

With regard to the half driving mode of FIG. 4, meshes are split into driving meshes and non-driving meshes. For example, every other mesh may be a driving mesh, whereas the remainder of meshes may be non-driving meshes. Driving machines are driven by corresponding drivers, whereas non-driving meshes are not driven and have no corresponding drivers. Therefore, in contrast with the full driving mode, the half driving mode depends on a total number of drivers that is less than a total number of all meshes. For example, the half driving mode may depend on 50% of the drivers that the full driving mode depends on.

In this example of FIG. 4, a 2N-rung DBC 400 has a row 402 of meshes $CH_{i-1}$, $CH_i$, $CH_{i+1}$ between a pair of end rings 404a, 404b. Amongst the illustrated meshes, only mesh $CH_{i-1}$ and mesh $CH_{i+1}$ is driven with current sources 410a, 410b. The current sources 410a, 410b correspond to individual drivers (not shown) and respectively provide currents $I_{i-1}$, $I_{i+1}$. Further, mesh $CH_i$ is not driven with an independent current and hence has no corresponding driver. Thus, the row 402 of meshes $CH_{i-1}$, $CH_i$, $CH_{i+1}$, etc., includes driving meshes (e.g., mesh $CH_{i-1}$ and mesh $CH_{i+1}$) and non-driving meshes (e.g., mesh $CH_i$). Non-driving mesh $CH_i$ is connected between neighboring driving meshes $CH_{i-1}$ and $CH_{i+1}$. In some embodiments, a total number of driving meshes is N and a total number of non-driving meshes is N, where N is an integer of two or more.

The currents by which driving mesh $CH_{i-1}$ and driving mesh $CH_{i+1}$ is driven can be represented in Eq. 7 as follows:

$$\begin{cases} I_{i-1} = I_0\mathrm{Cos}\left(\omega_0 t + \dfrac{i-1}{2N}*2\pi\right) \\ I_{i+1} = I_0\mathrm{Cos}\left(\omega_0 t + \dfrac{i+1}{2N}*2\pi\right) \end{cases} \qquad \text{Eq. 7}$$

Applying Eq. 2 above to the 2N-rung DBC 400 allows Eq. 7 to be simplified as represented below in Eq. 8:

$$I_i = \frac{I_0\mathrm{Cos}\left(\omega_0 t + \dfrac{i}{2N}*2\pi\right)*\mathrm{Cos}\left(\dfrac{\pi}{N}\right)}{1 + \dfrac{R_1}{R_2}}. \qquad \text{Eq. 8}$$

Comparing Eq. 8 to the full driving mode (e.g., Eq. 2), the current in mesh $CH_i$ results in the same phase, but a different magnitude. In addition, the scaling factor of the magnitude is $\mathrm{Cos}(\pi/N)/(1+R_1/R_2)$. In particular, the scaling factor is smaller than one and moves close to one as N becomes larger (e.g., moves toward infinity) because R1/R2 is becoming zero and $\mathrm{Cos}(\pi/N)$ is becoming one. Based on Eq. 8, it can be observed that the half driving mode effectively creates two N-rung DBCs with an azimuthal angle $$\frac{2\pi}{2N}$$

between them.

To understand the details of the two N-rung DBC, the rung currents may be calculated using Eq. 7 and Eq. 8. The rung currents of mesh $CH_i$ can be represented as follows:

$$\begin{cases} Irung_{i\_left} = -I_0\mathrm{Sin}\left(\dfrac{\pi}{N}\right)\mathrm{Sin}\left[\omega_0 t + \dfrac{i}{2N}*2\pi\right] \\ Irung_{i\_right} = -I_0\mathrm{Sin}\left(\dfrac{\pi}{N}\right)\mathrm{Sin}\left[\omega_0 t + \dfrac{i}{2N}*2\pi\right] \end{cases} \qquad \text{Eq. 9}$$

Thus, both the left and right rungs 414l, 414r of the mesh $CH_i$ have the same current. Further, the half driving mode effectively generates two identical N-rung DBCs with a $$\frac{2\pi}{2N}$$

rotation between them. For example, supposing a 2N-rung DBC in which N is 8, the half driving mode effectively generates two 8-rung DBCs. These two rotated, identical N-rung DBCs generate a more uniform $B_1+$ magnetic field than one N-rung DBC.

The same approach used to generate Eq. 5 and Eq. 6 for the full driving mode can also be used for the half driving mode. Particularly, the approach may be used to calculate the $B_1+$ field magnitude at the iso-center $B_{1+\_iso}$ and total power consumption at unloaded conditions without radiation loss considered. This may allow a Tx power efficiency comparison at the same ring current $I_0$. The calculated results are represented in Eq. 10 as follows:

$$\begin{cases} B_{1+\_iso} = B_1\mathrm{Cos}\left(\dfrac{\pi}{2N}\right) \qquad \text{Eq. 10} \\ \text{Unloaded total power} = 2NI_0^2 R_1\left(0.5 + 0.5\left(\dfrac{\mathrm{Cos}\left(\dfrac{\pi}{N}\right)}{1 + \dfrac{R_1}{R_2}}\right)^2\right) + \\ \qquad 2N\left(I_0\mathrm{Sin}\left(\dfrac{\pi}{N}\right)\right)^2 R_2 \end{cases}$$

Compared to the results of Eqs. 5 and 6, $B_{1+\_iso}$ of the half driving mode is slightly smaller than $B_{1+\_iso\_N}$ of the N-rung DBC in the full driving mode because $$\mathrm{Cos}\left(\frac{\pi}{2N}\right)$$

is slightly smaller than 1. For example, $$\mathrm{Cos}\left(\frac{\pi}{2N}\right) = 0.98$$

if N is 8. Regarding the unloaded total power, the first term for the half driving mode is slightly smaller than the first term for N-rung DBC in the full driving mode. The second term of the half driving mode is 50% of second term for the N-rung DBC in the full driving mode. Therefore, the half driving mode is more power efficient than the N-rung DBC in the full driving mode with half the drivers. A similar analysis may be performed with the 2N-rung DBC in the full driving mode to conclude that the half driving mode has about the same power efficiency as the 2N-rung birdcage coil in the full driving mode.

Note that the calculations above do not consider any radiation loss. If radiation loss were considered, more rungs in the row 402 lead to better magnetic uniformity and less current thereat. This is of particular benefit at high fields strengths, such as at 7 T and above.

Further note that, the CP/QD mode is defined as the driving phases changing 360 degrees around the DBC for one period. Higher degree modes, such as the driving phase changing 720 degrees, 1080 degrees, etc. around the DBC for one period, can also be used. The half driving mode for a 2N-rung DBC can still drive all various modes of operation allowed by an N-rung DBC but not necessarily all the various modes of operation allowed by a 2N-rung DBC. Therefore, the highest mode of operation for the half driving 2N DBC is limited by the highest mode of operation for the full driving N-rung DBC even though there are 2N rungs.

With reference to FIGS. 3 and 4, the 2N-rung and N-rung DBCs above can be configured with rungs (e.g., rungs 306 or 406) being equally spaced and/or with the same mesh size (e.g., for meshes $CH_{i-1}$, $CH_i$, $CH_{i+1}$). Alternatively, with the half driving mode, the mesh sizes may be different. A distance or spacing between rungs 406, for example, can be d1 for driving meshes $CH_{i-1}$, $CH_{i+1}$, and d2 for the non-driving mesh $CH_i$, where d1 and d2 are different from one another and not necessarily equal. The d1 can be greater than d2, or vice versa. Because the half driving mode allows different rung spacings and/or mesh sizes, it provides more design flexibility for different anatomies. Additionally, the half driving mode can still achieve an improved Tx mode performance by increasing transmit power efficiency, magnetic field uniformity, and safety, when compared to a coil with less rungs/meshes (e.g., 50% less rungs/meshes), for example.

Although circuit elements including ring capacitors C1, ring inductors L1, and ring resistors R1 are illustrated herein as being the same or similar for ease of description, these can vary in value among different meshes or within a mesh for tuning each mesh to a working frequency, for example. Similarly, circuit elements including rung capacitors C2, rung inductors L2, and rung resistors R2 vary in value among different meshes or within a mesh for tuning each mesh to a working frequency, for example.

Figure 5:
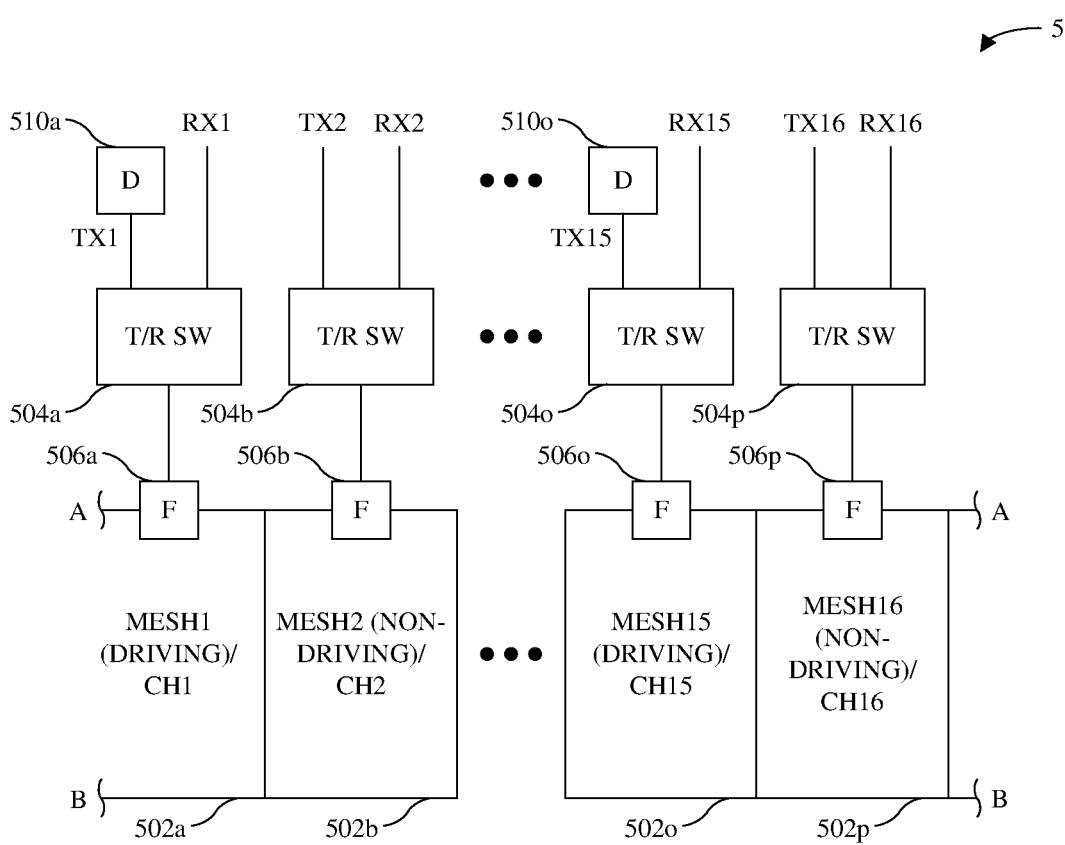
FIG. 5 illustrates some embodiments of a 2N-rung DBC configured for a half driving mode, where N is 8 and the 2N-rung DBC is coupled to transmit/receive (T/R) switches.

Referring to FIG. 5, a 2N-rung DBC 500 comprises a row of meshes 502a-502p electrically coupled respectively to T/R switches 504a-504p. For simplicity and ease of description, capacitors, inductors, and other supporting components or circuit elements are not illustrated in FIG. 5 but can also be configured for tuning the 2N-rung DBC 500. Further, as above the 2N-rung DBC 500 is flattened for ease of illustration, but may, for example, be circumferentially arranged around a cylindrical former (e.g., as in FIG. 1B).

Each T/R switch 504A-504H selectively electrically couples a transmission port TX1-TX16 and a reception port RX1-RX16 to a corresponding one of the meshes 502a-502p. The T/R switches 504a-504p can be employed for passing signals respectively from the meshes 502a-502p respectively to the reception ports RX1-RX16 in a receive mode. Further, the T/R switches 504a-504p can be employed for providing signals from the transmission ports TX1-TX16 respectively to the meshes 502a-502p in a transmit mode. Hence, the T/R switches 504a-504p can configure the 2N-rung DBC 500 for use in a pTx mode and a phase-array Rx mode. The T/R switches 504a-504p can be electrically coupled to the meshes 502a-502p (e.g., channels or RF coil elements) at individual feed boards 506a-506p of the meshes 502a-502p.

As noted above, the feed boards 506a-506p may, for example, be or comprise matching circuits. In some embodiments, the feed boards (e.g., 506a and 506o) for driving meshes have a different layout of circuit components and/or different circuit component values than feed boards (e.g., 506b and 506p) for the non-driving meshes. For example, the driving meshes may have transmit and receive feed boards, whereas the non-driving meshes may have receive-only feed boards. In other embodiments, the feed boards (e.g., 506a and 506o) for driving meshes have the same layout of circuit components and/or have the same circuit component values as feed boards (e.g., 506b and 506p) for the non-driving meshes.

The row of meshes 502a-502p includes sixteen meshes. Every other mesh corresponds to a driving mesh (e.g., meshes 502a, 502o), such that the row has N=8 driving meshes. The remainder of meshes correspond to non-driving meshes (e.g., meshes 502b, 502p), such that the row has N=8 non-driving meshes.

The driving meshes are electrically coupled to corresponding drivers (e.g., driver 510a, 510o), which provide transmit signals to corresponding transmission ports (e.g., TX1 and TX15) to drive the driving meshes according to the half driving mode. Each driver (e.g., driver 510a, 510o) can operate independently and separately from each other drivers to drive a current directly to a corresponding driving mesh or channel. The drivers may, for example, comprise individual RF power amplifier (RFPA) or the like. The non-driving meshes are devoid of drivers, whereby corresponding transmission ports (e.g., TX2 and TX16) may be unused. Each non-driving mesh (e.g., 502b, 502p) is between two neighboring driving meshes and has two rungs shared respectively with the two neighboring driving meshes.

Although the driving meshes and the non-driving meshes are configured to alternate one-to-one around the 2N-rung DBC 500, other configurations are also envisioned. For example, the driving meshes, and the non-driving meshes may alternate between two-to-one, one-to-two, three-to-one, two-three, etc. in alternative embodiments. Further, although sixteen meshes are connected together in the row (e.g., N is equal to 8), a different number of meshes can also be configured (e.g., N may equal 2, 3, 4, or some other suitable integer value). Further, although a number of driving meshes is equal to a number of drivers, this may not be the case in alternative embodiments. For example, rather than 8 drivers for 8 driving meshes, there may be 4 drivers for 8 driving meshes, where the 8 driving meshes are grouped into 4 pairs of driving meshes and each pair shares one of the 4 drivers via power splitters, phase shifters, etc.

In the receive mode, the 2N-rung DBC 500 can operate so that all the meshes 502a-502p (driving and non-driving) are used as receivers. The T/R switches 504a-504o can output signals respectively from the meshes respectively via the reception ports RX1-RX16.

Figure 6:
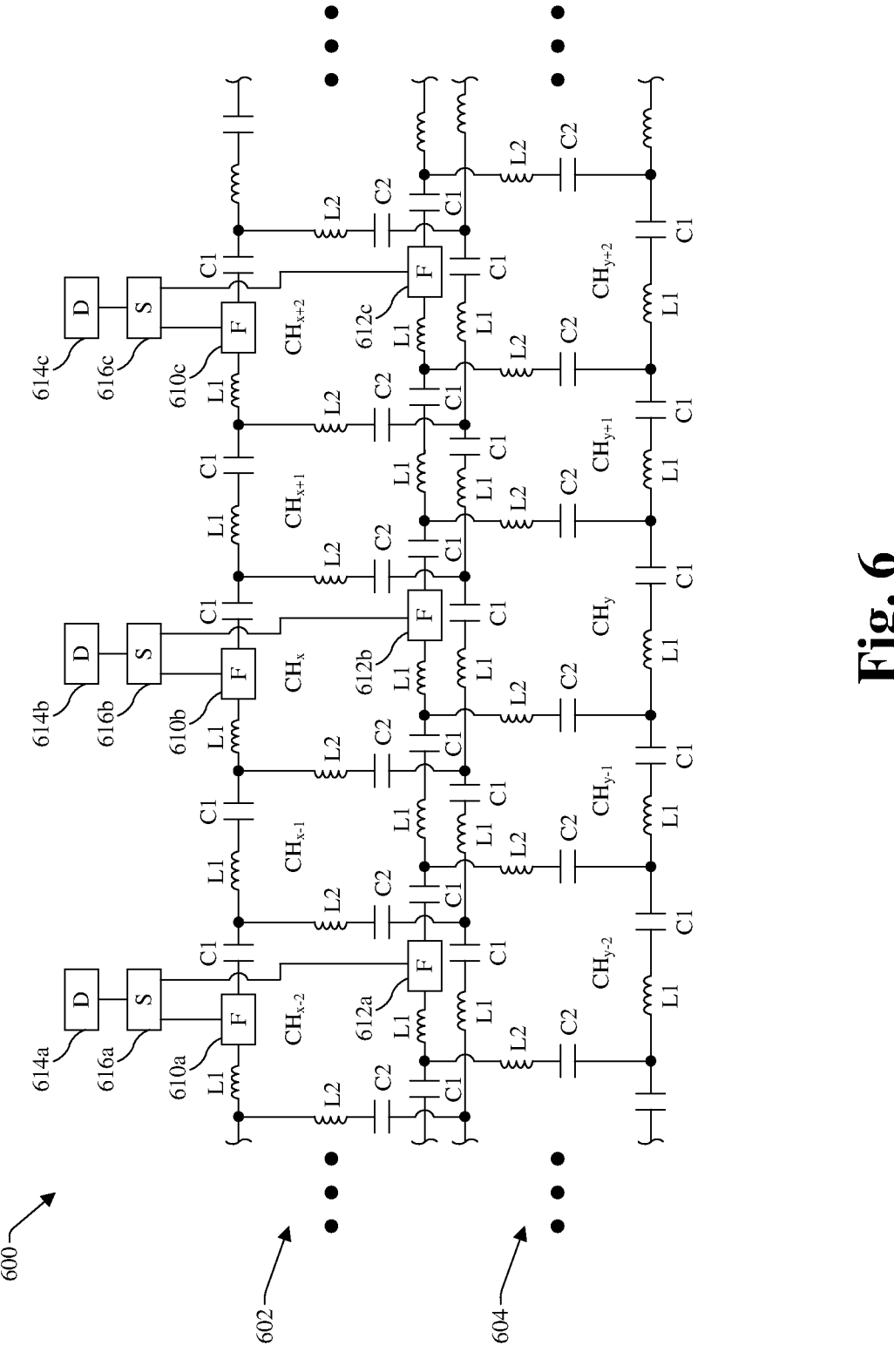
FIG. 6 illustrates some embodiments of a 2N-rung DBC configured for a half driving mode and having two rows.

Referring to FIG. 6, a 2N-rung DBC 600 comprising two rows of meshes is provided. The 2N-rung DBC 600 is flattened for ease of illustration, but may, for example, be circumferentially arranged around a cylindrical former (e.g., as in FIG. 1B). Further, the 2N-rung DBC 600 can, for example, be employed in a Tx mode or an Rx mode.

Rather than including one row of meshes (e.g., as in other figures), the 2N-rung DBC 600 includes a first row 602 of meshes (e.g., $CH_{x-2}$, $CH_{x-1}$, $CH_x$, $CH_{x+1}$, $CH_{x+2}$) and a second row 604 of meshes (e.g., $CH_{y-2}$, $CH_{y-1}$, $CH_y$, $CH_{y+1}$, $CH_{y+2}$) that are configured to operate together. Use of multiple rows may help improve $B_1$ magnetic field uniformity. The first and second rows 602, 604 partially overlap to minimize inductive coupling between the first and second rows 602, 604. Further, the first and second rows 602, 604 have an azimuthal offset to further minimize inductive coupling between the first and second rows 602, 604. By minimizing the inductive coupling, imaging quality of an MRI scan target may be enhanced.

In alternative embodiments, the 2N-rung DBC 600 may have no azimuthal offset between the first and second rows 602, 604 or a different azimuthal offset than illustrated. Further, in alternative embodiments, the 2N-rung DBC 600 may include no overlap between the first and second rows 602, 604. Further yet, in alternative embodiments, the 2N-rung DBC 600 may include more than two rows of meshes.

While the half driving mode has thus far been shown with a single row of meshes, the half driving mode can also be used for two or more rows of meshes. First feed boards 610a, 610b, 610c, etc. (collectively or individually referenced also as "610") are connected at driving meshes (e.g., $CH_{x-2}$, $CH_x$, $CH_{x+2}$) in the first row 602, and second feed boards 612a, 612b, 612c, etc. (collectively or individually referenced also as "612") are connected at driving meshes (e.g., $CH_{y-2}$, $CH_y$, $CH_{y+2}$) in the second row 604. Drivers 614a, 614b, 614c, etc. (collectively or individually referenced also as "614") are connected respectively to the first feed boards 610 and respectively to the second feed boards 612 via power splitters (S) 616a, 616b, 616c, etc. (collectively or individually referenced also as "616").

Because the isolations between meshes in different rows are usually good, or one can find two meshes of different rows having good isolation, each driver 614 can be used to drive one mesh per row using a power splitter 616. The power splitter 616 may, for example, be or comprise a 2-to-1 power splitter or the like. Therefore, 8-channel pTx hardware may, for example, be used to drive the 2N-rung DBC 600 in Tx mode when N is 8 (e.g., 16 meshes per row). In addition, when N is 8, the 2N-rung DBC 600 may have 32 Rx channels in receive mode.

While the non-driving meshes (e.g., $CH_{x-1}$, $CH_{x+1}$, $CH_{y-1}$, $CH_{y+1}$) in the first and second rows 602, 604 are illustrated as having the same size and rung spacing, the non-driving meshes in the first row 602 may have a different size and/or rung spacing than in the second row 604. Similarly, while the driving meshes (e.g., $CH_{x-2}$, $CH_x$, $CH_{x+2}$, $CH_{y-2}$, $CH_y$, $CH_{y+2}$) in the first and second rows 602, 604 are illustrated as having the same size and rung spacing, the driving meshes in the first row 602 may have a different size and/or rung spacing than in the second row 604.

Further, while the non-driving meshes (e.g., $CH_{x-1}$, $CH_{x+1}$) in the first row 602 are illustrated as having a different size and rung spacing as the driving meshes (e.g., $CH_{x-2}$, $CH_x$, $CH_{x+2}$) in the first row 602, the driving and non-driving meshes in the first row 602 may have the same size and/or rung spacing. Similarly, while the non-driving meshes (e.g., $CH_{y-1}$, $CH_{y+1}$) in the second row 604 are illustrated as having a different size and rung spacing as the driving meshes (e.g., $CH_{y-2}$, $CH_y$, $CH_{y+2}$) in the second row 604, the driving and non-driving meshes in the second row 604 may have the same size and/or rung spacing.

In some embodiment of the 2N-rung DBC 600, N can be 8 and hence the first and second rows 602, 604 may, for example, each have 16 meshes. In alternative embodiments, N may be 4 or some other suitable number.

While FIG. 6 illustrates an example 2N-rung DBC 600 that includes various components connected in various ways, it is to be appreciated that other 2N-rung DBCs can include other components and/or connections in other ways and can be employed in connection with various embodiments discussed in the present disclosure. Although circuit elements including ring capacitors C1 and ring inductors L1 are illustrated herein as being a same or similar within and between meshes for ease of description, these can vary in value among different meshes or within a mesh for tuning each mesh to a working frequency. Likewise, circuit elements including rung capacitors C2 and rung inductors L2 can vary in value among different meshes or within a mesh for tuning each mesh to a working frequency.

Figure 7:
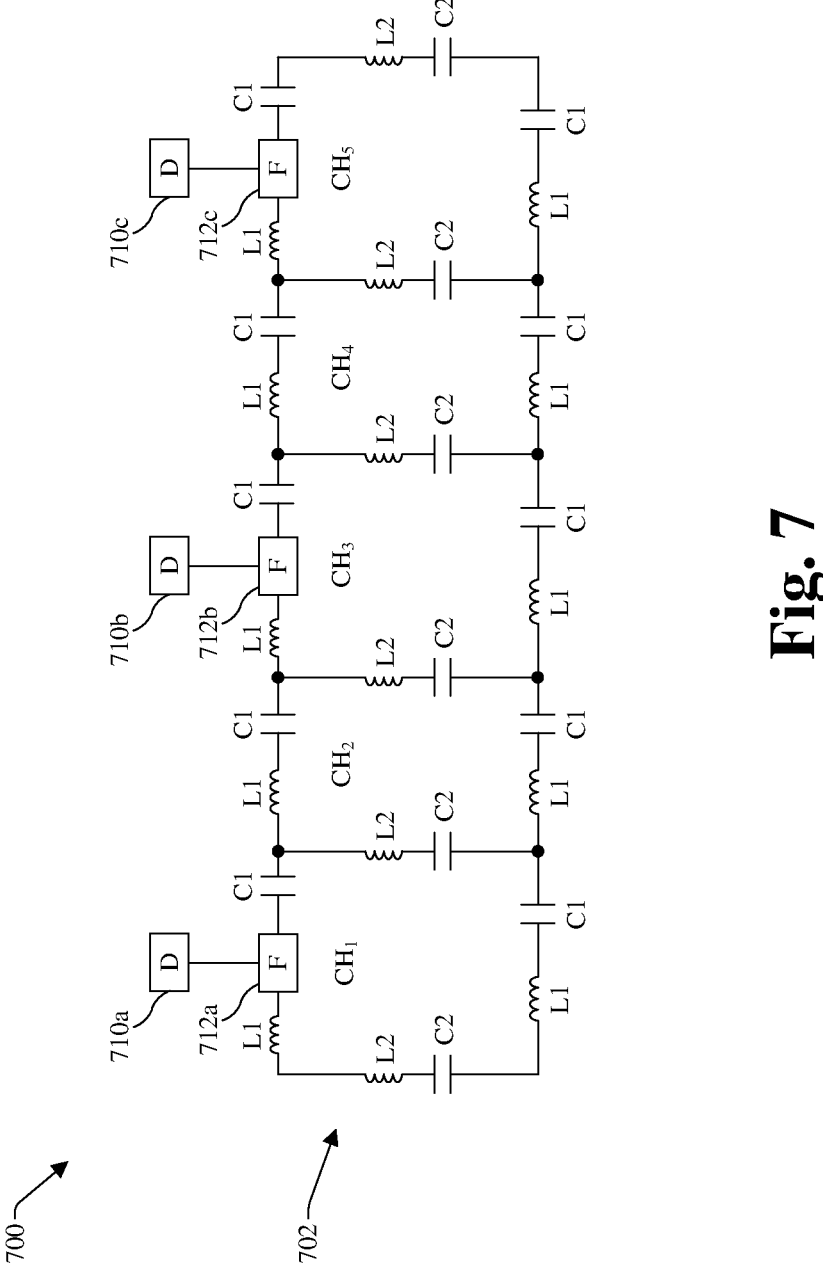
FIG. 7 illustrates some embodiments of a 2N-rung ladder coil configured for a half driving mode, where N is 5.

While the present disclosure has thus far focused on using of the half-driving mode with 2N-rung DBC, it is to be appreciated that that the half-driving mode is also applicable to a 2N-rung ladder coil. The ladder coil is similar to a birdcage coil regarding rungs and meshes. However, end rings are replaced with end legs. Further, two meshes of the ladder coil are respectively on opposite ends of the ladder coil and each of these meshes neighbors only one other mesh. FIG. 7 shows an example of a 2N-rung ladder coil 700 in which N is 3. In alternative embodiments, N may be 4, 8, or some other suitable integer greater than two.

The 2N-rung ladder coil 700 has a total of 2*N rungs, which forms (2*N)−1 mesh (e.g., $CH_1$ through CHs). These meshes are arranged in a single row 702 and are split into driving N meshes and N−1 non-driving meshes according to the half driving mode. In alternative embodiments, the 2N-run ladder coil 700 may have one or more additional rows each driven in a Tx mode according to the half driving mode.

The N drivers 710a, 710b, 710c are electrically coupled respectively to N driving meshes (e.g., $CH_1$, $CH_3$, $CH_5$) via corresponding feed boards 712a, 712b, 712c. Further, the N driving meshes alternate along a length of the 2N-rung ladder coil 700 with N−1 non-driving meshes (e.g., $CH_2$ and $CH_4$). Hence, in accordance with the half driving mode, the 2N-rung ladder coil 700 depends on a total number of drivers that is less than the total number of meshes.

The 2N-run ladder coil 700 can be used in various anatomies, such as spine, body, foot, etc. Further, the shape of the 2N-run ladder coil 700 can be flat, curved, U shaped, C shaped, and so on depending on the shape of the anatomy to be imaged. Further yet, the ladder coil may, for example, operate in a degenerate mode by being configured along a flat plane or with slight curvature to maintain a low coupling among non-direct neighbor meshes (or coils).

Figure 8:
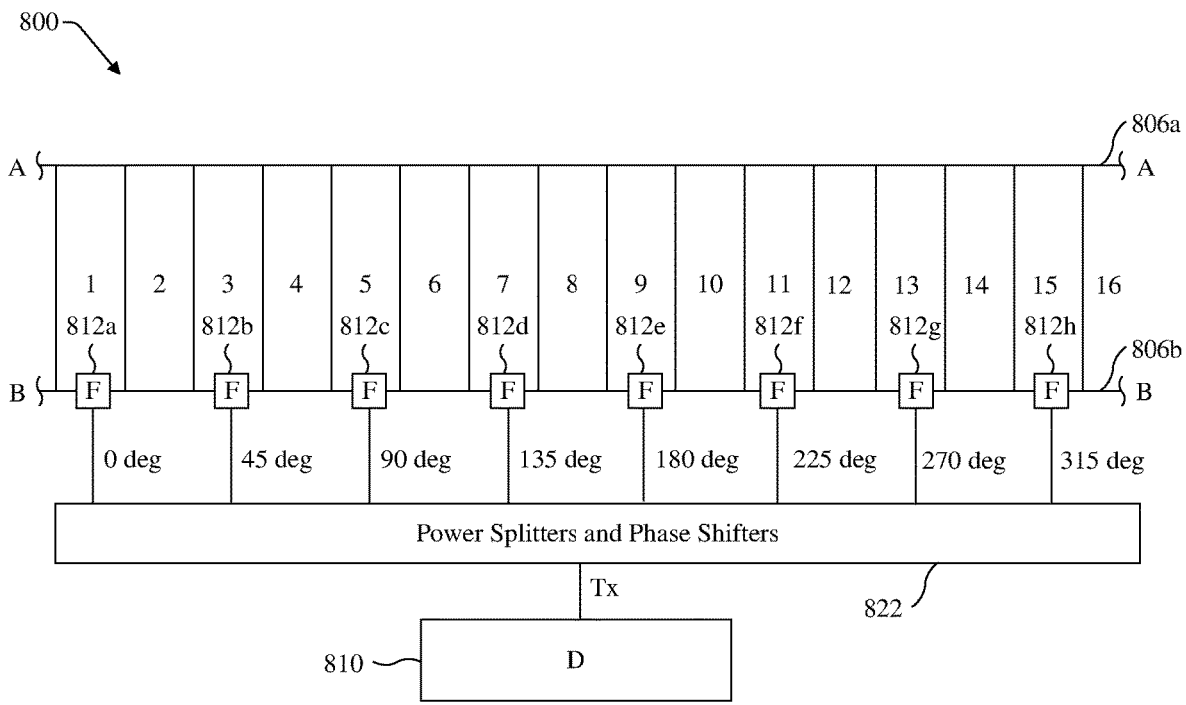
FIG. 8 illustrates some embodiments of a 2N-rung DBC configured for a half driving mode, where N is 8 and the 2N-rung DBC is coupled to power splitters and phase shifters.

FIG. 8 illustrates an example of a 16-rung DBC 800 using the half driving mode with power splitters and phase shifters 822 and a single driver 810 for driving a current in a transmit mode to the 16-rung DBC 800. For ease of illustration, capacitors, inductors, and other support parts are not drawn. Further, while applied to a DBC, the power splitters and phase shifters 822 and the single driver 810 may also be applied to a ladder coil.

The 16-rung DBC 800 has a first end ring 806a and a second end ring 806b. Further, the 16-rung DBC 800 has 16 rungs extending from the first end ring 806a to the second end ring 806*b*. In alternative embodiments, the 16-rung DBC 800 has some other suitable number of rungs, such as 6 rungs, 32 rungs, etc. The power splitters and phase shifters 822 are configured to translate a transmit signal Tx from the driver 810 to an appropriate phase and magnitude for each of the driving meshes (e.g., odd numbered meshes). Further, the power splitters and phase shifters 822 may, for example, be electrically coupled to the driving meshes respectively via feed boards 812*a*-812*h* (collectively 812).

As discussed above in various aspects, a greater number of rungs (e.g., 16 as illustrated or more) in an MRI RF coil can provide a better magnetic field uniformity in a CP mode. However, more rungs can demand more drivers and more cost for pTx operation. For example, 16 drivers could be utilized in a 16-rung DBC, which leads to a high total cost of a pTX driver system. By utilizing configurations of a DBC or ladder coil with a half driving mode, the number of drivers can be reduced (e.g., by 50% in the case of a DBC) while realizing an increase in power efficiency and magnetic field uniformity.

While the half driving mode has thus far been described with regard to one Tx application, it may be extended to two Tx applications at 3 T (and below) by using power splitters and phase shifters (e.g., the power splitters and phase shifters 822). For example, at 3 T and lower, because dielectric resonance of anatomy is not severe, the system WBC or other Tx/Rx coils can only use the uniform mode. The uniform mode has two independent directions, whereby the set of physical channels of the coil may be treated as two separate sets of logical channels (a set for each direction). The two sets of logical channels may be driven in a CP mode or may be driven separately from each other. For example, a first set of logical channels may be driven by only a first driver via power splitters and phase shifters, whereas a second set of logical channels may be driven by only a second driver via power splitters and phase shifters.

Figure 9A:
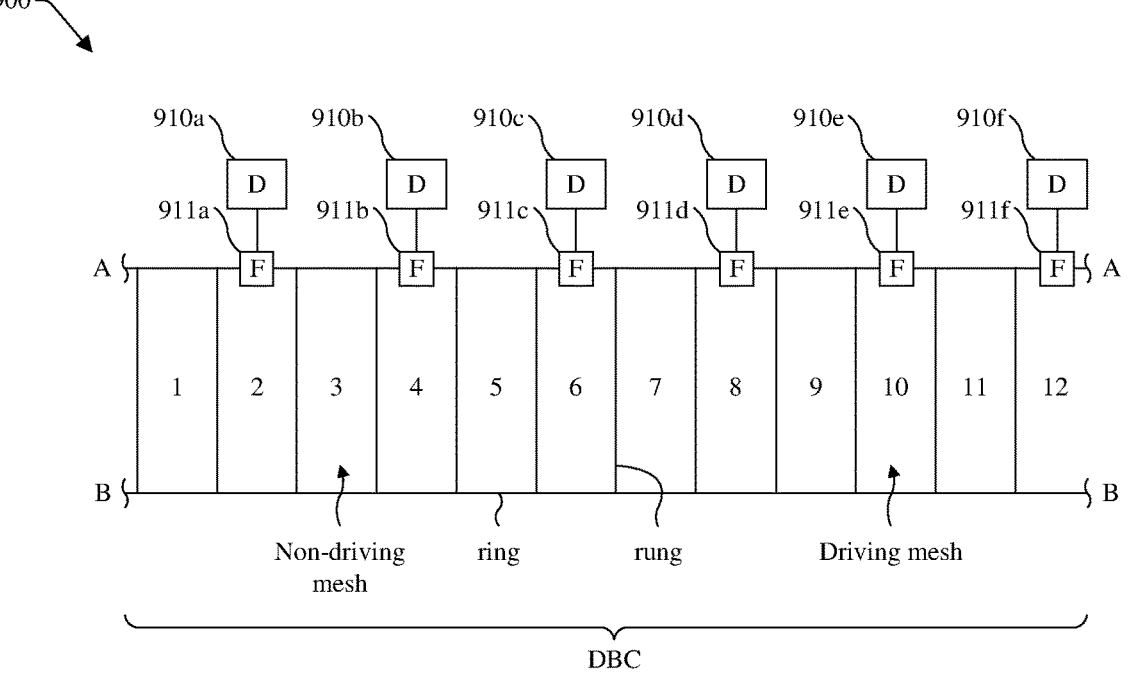
FIG. 9A illustrates some embodiments of a 2N-rung DBC configured for a half driving mode, where N is 6.

With reference to FIG. 9A, some aspects of a 2N-rung DBC 900 are provided in which N is 6 and in which the 2N-rung DBC 900 is driven according to the half driving mode. Other suitable values of N are, however, amenable. N driving meshes and N non-driving meshes alternate in a row of the 2N-rung DBC 900. The N driving meshes are electrically coupled to corresponding drivers 910*a*-910*f* (N in total) via corresponding feed boards 911*a*-911*f* (N in total). The non-driving meshes are not electrically coupled to drivers and, some embodiments, are devoid feed boards, matching circuits, and the like.

Figure 9B:
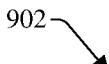
FIG. 9B illustrates some embodiments of a 2N-rung ladder coil configured for a half driving mode, where N is 6.
Figure 9B:
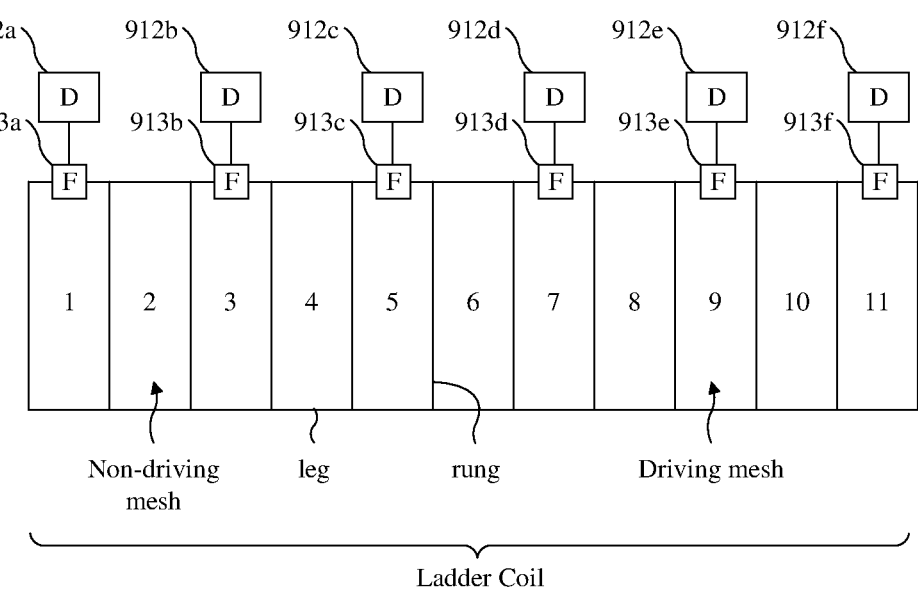

With reference to FIG. 9B, some aspects of a 2N-rung ladder coil 902 are provided in which N is 6 and in which the 2N-rung ladder coil 902 is driven according to the half driving mode. Other suitable values of N are, however, amenable. N driving meshes and N−1 non-driving meshes alternate in a row of the 2N-run ladder coil 902. The N driving meshes are electrically coupled to corresponding drivers 912*a*-912*f* (N in total) via corresponding feed boards 913*a*-913*f* (N in total). The non-driving meshes are not electrically coupled to drivers and, some embodiments, are devoid feed boards, matching circuits, and the like.

Figure 10:
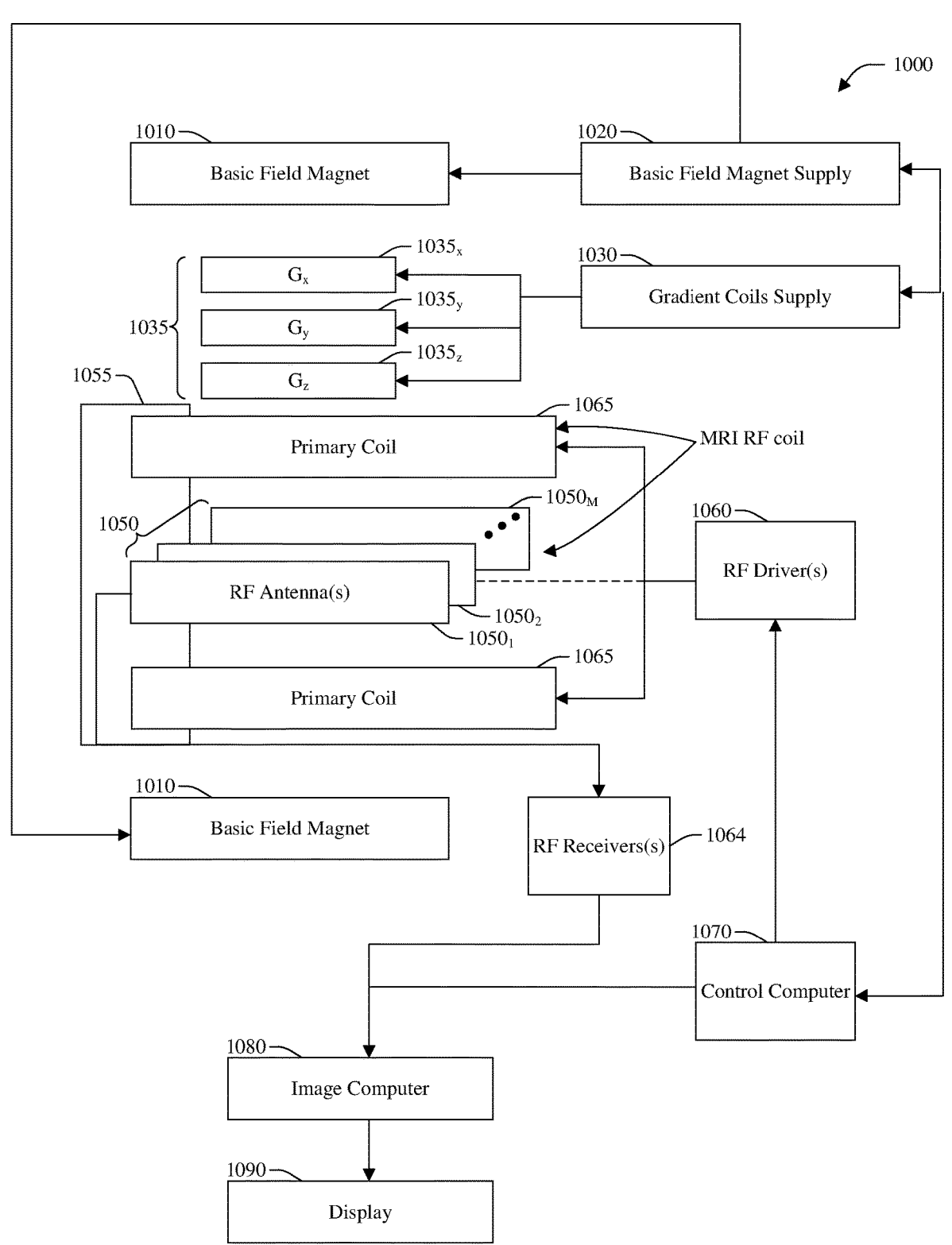
FIG. 10 illustrates a block diagram of some embodiments of a magnetic resonance imaging (MRI) system comprising a 2N-rung DBC or ladder coil configured for a half driving mode.

With reference to FIG. 10, a block diagram of some aspects of an MRI system 1000 according to aspects of the present disclosure is provided. The MRI system 1000 can be configured with example MRI RF coils, coil channels, coil elements, coil arrays, or circuitry according to one or more aspects described herein.

The MRI system 1000 includes one or more basic field magnets 1010 and a basic field magnet supply 1020. The basic field magnet(s) 1010 are configured to produce a uniform or substantially uniform $B_0$ field. The MRI system 1000 includes gradient coils 1035 configured to emit gradient magnetic fields like $G_x$ (e.g., via an associated gradient coil 1035*x*), $G_y$ (e.g., via an associated gradient coil 1035*y*), and $G_z$ (e.g., via an associated gradient coil 1035*z*). The gradient coils 1035 can be controlled, at least in part, by a gradient coils supply 1030. In some examples, the timing, strength, and orientation of the gradient magnetic fields can be controlled, and thus selectively adapted during an MRI procedure.

The MRI system 1000 can include a primary coil 1065 configured to generate RF pulses. The primary coil 1065 can be a WBC. The primary coil 1065 can, for example, be a DBC or ladder coil according to any of the embodiments described with regard to FIGS. 1A, 1B, 2-8, 9A, and 9B. The primary coil 1065 can be controlled, at least in part, by one or more RF drivers 1060 and be shielded at least in part by shielding structure 1055. The shielding structure 1055 can at least partially surround the primary coil 1065 to prevent coupling between the primary coil 1065 and surrounding structure (e.g., the gradient coils 1035 or other suitable structure). The RF drivers(s) 1060 can provide a transmit signal to the primary coil 1065.

In some embodiments, the primary coil 1065 is driven in the half driving mode according to aspects of the present disclosure. In some embodiments in which the primary coil 1065 is a DBC, the primary coil 1065 has 2N rungs and 2N meshes. In some embodiments in which the primary coil 1065 is a ladder coil, the primary coil 1065 has 2N rungs and 2N−1 meshes. For both the DBC and the ladder coil, the MRI system 1000 has only N RF drivers(s) 1060.

The MRI system 1000 can include a set of RF antennas 1050 (e.g., one or more RF antennas 1050₁-1050$_M$, which can be as described herein). The RF antennas 1050 can be configured to generate RF pulses and/or to receive resulting magnetic resonance signals from an object to which the RF pulses are directed. An RF antenna 1050 configured solely to generate RF pulses can be referred to herein as a Tx antenna (or coil or coil array), while an RF antenna 1050 configured solely to receive resulting magnetic resonance signals from an object to which the RF pulses are directed can be referred to herein as a Rx antenna (or coil or coil array). An RF antenna 1050 configured to both generate RF pulses and receive resulting magnetic resonance signals can be referred to herein as a Tx/Rx antenna (or coil or coil array). Unless otherwise indicated, antennas, coils, and coil arrays discussed herein can, in various embodiments, be any of a Tx antenna/coil/coil array, a Rx antenna/coil/coil array, or a Tx/Rx antenna/coil/coil array.

In some embodiments, the RF antennas 1050 can be configured to inductively couple with the primary coil 1065, and to generate RF pulses and/or to receive resulting magnetic resonance signals from an object to which the RF pulses are directed. In other embodiments, the RF antennas 1050 can be electrically coupled to a power source (e.g., the RF drivers(s) 1060) that can drive the RF antennas 1050 to generate RF pulses, and the RF antennas 1050 can also be configured to receive resulting magnetic resonance signals from an object to which the RF pulses are directed. In one embodiment, one or more members of the set of RF antennas 1050 can be fabricated from flexible coaxial cable or other conductive material. The set of RF antennas 1050 can be connected with one or more RF receivers 1064.

In some embodiments, the RF antennas 1050 are or comprise a DBC or ladder coil according to aspects of the present disclosure. In some of such embodiments, the DBC or ladder coil is driven in the half driving mode according to any of the embodiments described with regard to FIGS. 1A, 1B, 2-8, 9A, and 9B. In some embodiments in which the RF antennas 1050 are or comprise a DBC, the DBC has 2N rungs and 2N meshes. Further, the MRI system 1000 has only N RF drivers 1060 (one for each driving mesh) and 2N RF receivers 1064 (one for each mesh). In some embodiments in which the RF antennas 1050 are or comprise a ladder coil, the ladder coil has 2N rungs and 2N–1 meshes. Further, the MRI system 1000 has only N RF drivers 1060 (one for each driving mesh) and 2N–1 RF receivers 1064 (one for each mesh).

The gradient coils supply 1030 and the RF driver(s) 1060 can be controlled, at least in part, by a control computer 1070. The magnetic resonance signals received from the set of RF antennas 1050 can be employed to generate an image, and thus can be subject to a transformation process like a two-dimensional fast Fourier transform (FFT) that generates pixelated image data. The transformation can be performed by an image computer 1080 or other similar processing device. The image data can then be shown on a display 1090. The RF receiver(s) 1064 can be connected with the control computer 1070 or the image computer 1080.

While FIG. 10 illustrates an example MRI system 1000 that includes various components connected in various ways, it is to be appreciated that other MRI systems can include other components connected in other ways and can be employed in connection with various embodiments discussed herein. In one embodiment, the MRI system 1000 includes the control computer 1070. In some embodiments, a member of the set of RF antennas 1050 can be individually controllable by the control computer 1070. The control computer 1070 can provide a DC bias current, or control a DC bias control circuit to control the application of a DC bias current, to PIN diodes that can be part of the RF antennas 1050 and/or the primary coil 1065.

With reference to FIG. 11, a block diagram 1100 of some embodiments of a method for MRI using a half driving mode according to aspects of the present disclosure is provided. The method can, for example, be performed by the MRI system of FIG. 10.

At act 1102, a DBC is provided. The DBC comprises a pair of end rings and a plurality of rungs connecting the pair of end rings. The pair of end rings and the plurality of rungs form a plurality of meshes in a row, and the plurality of meshes comprises N driving meshes and N non-driving meshes. Further, each of the driving meshes is between and borders two nearest non-driving meshes. In some embodiments, the DBC is as in any of FIGS. 1A, 1B, 2-6, 8, and 9A. In alternative embodiments, the DBC is replaced with a ladder coil, which can, for example, be as in any of FIGS. 7 and 9B.

At act 1104, a scan object and the DBC are arranged proximate to each other. For example, to the extent that the DBC is used as a WBC, the scan object can be arranged within the bore of a scanner. As another example, to the extent that the DBC is used as a local coil, the DBC can be arranged on the scan object.

At act 1106, a $B_0$ magnetic field is applied to the scan object to align nuclei spinning in the scan object to the $B_0$ magnetic field.

At act 1108, gradient fields are applied to the scan object to select a portion of the scan object.

At act 1110, a $B_1$ magnetic field is applied to the scan object using the DBC according to the half driving mode. The $B_1$ magnetic field excites nuclei of the selected portion, and the applying comprises driving the DBC with only N drivers, which generate N transmit signals respectively applied to the N driving meshes. The 2N meshes of the DBC result in high performance, whereas the half driving mode reduces the number of transmit channels and/or drivers by half to reduce costs.

At act 1112, MRI signals are received from the excited nuclei of the selected portion using the driving and non-driving meshes as 2N receive channels.

At act 1114, an image of the selected portion is generated using the received MRI signals.

While the block diagram 1100 of FIG. 11 is illustrated and described herein as a series of acts or events, it will be appreciated that the illustrated ordering of such acts or events is not to be interpreted in a limiting sense. For example, some acts can occur in different orders and/or concurrently with other acts or events apart from those illustrated and/or described herein. Further, not all illustrated acts can be required to implement one or more aspects or embodiments of the description herein, and one or more of the acts depicted herein can be carried out in one or more separate acts and/or phases.

In an Example 1, a MRI RF coil comprises: a first end structure and a second end structure; and a plurality of rungs elongated from the first end structure to the second end structure to form a plurality of meshes in a first row, wherein the plurality of meshes comprise a plurality of driving meshes forming transmit channels of the MRI RF coil and further comprise a plurality of non-driving meshes, and wherein each non-driving mesh of the plurality of non-driving meshes is between and borders a pair of driving meshes of the plurality of driving meshes; wherein the MRI RF coil has a total number of transmit channels in the first row equal to half a total number of rungs in the first row, and wherein the MRI RF coil is a DBC or a ladder coil.

In an Example 2 that depends on Example 1, the MRI RF coil further comprises a plurality of feed boards respectively on the plurality of driving meshes, wherein the MRI RF coil has a total number of feed boards equal to half the total number of rungs in the first row.

In an Example 3 that depends on any one of Examples 1 and 2, the plurality of driving meshes and the plurality of non-driving meshes form receive channels of the MRI RF coil, wherein the MRI RF coil has a total number of receive channels equal to a total number of meshes in the first row.

In an Example 4 that depends on any one of Examples 1-3, the plurality of driving meshes share a first size, and the plurality of non-driving meshes share a second size different than the first size.

In an Example 5 that depends on any one of Examples 1-4, the MRI RF coil is the DBC, and a total number of driving meshes in the first row is equal to a total number of non-driving meshes in the first row.

In an Example 6 that depends on any one of Examples 1-4, the MRI RF coil is the ladder coil, wherein a total number of driving meshes in the first row is equal half the total number of rungs in the first row, and wherein a total number of non-driving meshes in the first row is equal to one less than the total number of driving meshes in the first row.

In an Example 7 that depends on any one of Examples 1-6, the MRI RF coil comprises: a third end structure and a fourth end structure; and a plurality of additional rungs elongated from the third end structure to the fourth end structure to form a plurality of additional meshes in a second row, which overlaps with the first row, wherein the plurality of additional meshes comprise driving meshes and non-driving meshes.

In an Example 8 that depends on Example 7, the MRI RF coil comprises a plurality of splitters, each electrically coupled to a driving mesh in the first row and a driving mesh in the second row, wherein the MRI RF coil has a total number of splitters equal to half the total number of rungs in the first row.

In an Example 9, an MRI system comprising: a RF coil that is a degenerate birdcage RF coil or a ladder RF coil, wherein the RF coil comprises: a first end structure and a second end structure; and a plurality of rungs elongated in parallel from the first end structure to the second end structure to form a plurality of meshes in a first row, wherein the plurality of meshes comprise a plurality of driving meshes and a plurality of non-driving meshes, each non-driving mesh of the plurality of non-driving meshes being between and bordering a pair of driving meshes of the plurality of driving meshes; and a driver system comprising one or more drivers, wherein only the plurality of driving meshes amongst the plurality of meshes are electrically coupled to the driver system.

In an Example 10 that depends on Example 9, the one or more drivers comprise a plurality of drivers electrically coupled respectively to the plurality of driving meshes, wherein a total number of drivers electrically coupled to the RF coil is equal to half a total number of rungs of the RF coil.

In an Example 11 that depends on Example 9, the one or more drivers has only a single driver, wherein the MRI system comprises power splitters and phase shifters configured to split an input channel electrically coupled to the single driver into a plurality of output channels, which total a number equal to half the total number of rungs of the RF coil and which are electrically coupled respectively to the plurality of driving meshes.

In an Example 12 that depends on any one of Examples 9-11, the MRI system further comprises a plurality of T/R switches electrically coupled respectively to the plurality of meshes, wherein the one or more drivers are electrically coupled to the plurality of driving meshes via corresponding ones of the plurality of T/R switches.

In an Example 13 that depends on any one of Examples 9-12, the RF coil further comprises: a third end structure and a fourth end structure; and a plurality of additional rungs elongated in parallel from the third end structure to the fourth end structure to form a plurality of additional meshes in a second row, wherein the plurality of additional meshes comprise a plurality of driving meshes and a plurality of non-driving meshes, and wherein only driving meshes amongst the plurality of additional meshes are electrically coupled to drivers.

In an Example 14 that depends on Example 13, the second row partially overlaps with the first row.

In an Example 15 that depends on any one of Examples 9-14, a total number of driving meshes in the first row equals a total number of non-driving meshes in the first row.

In an Example 16, a method for MRI comprises providing a RF coil, which is a degenerate birdcage RF coil or a ladder RF coil, wherein the RF coil comprises a plurality of rungs coupled to form at least one row of meshes, the meshes comprising non-driving meshes and driving meshes, each non-driving mesh coupled between a pair of neighboring driving meshes; and performing MRI on a scan target to generate an image of the scan target at a working frequency, wherein the performing comprises driving, via one or more drivers, the driving meshes only to transmit RF pulses into the scan target.

In an Example 17 that depends on Example 16, the method further comprises switching, via transmit/receive switches coupled to the driving meshes and the non-driving meshes, between a transmit mode and a receive mode.

In an Example 18 that depends on any one of Examples 16 and 17, the at least one row of meshes comprises a first row, wherein the RF coil is the degenerate birdcage RF coil, and wherein the driving drives only half of a total number of meshes in the first row.

In an Example 19 that depends on any one of Examples 16 and 17, the at least one row of meshes comprises a first row, wherein the RF coil is the ladder RF coil, and wherein the driving drives only a number of meshes equal to half of a total number of rungs in the first row.

In an Example 20 that depends on any one of Examples 16-19, the at least one row of meshes comprises a first row and a second row, and wherein the driving drives driving meshes in the first and second rows without driving non-driving meshes in the first and second rows.

The following includes definitions of selected terms employed herein. The definitions include various examples or forms of components that fall within the scope of a term and that may be used for implementation. The examples are not intended to be limiting. Both singular and plural forms of terms may be within the definitions.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which embodiments belong. It will be further understood that terms (e.g., those defined in commonly used dictionaries) should be interpreted as having a meaning that is consistent with their meaning in the context of the relevant art and will not be interpreted in an idealized or overly formal sense unless expressly so defined herein.

In the above description, some components may be displayed in multiple figures carrying the same reference signs but may not be described multiple times in detail. A detailed description of a component may then apply to that component for all its occurrences.

The detailed descriptions presented herein may be presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on refer to actions and processes of a computer system, logic, processor, or similar electronic device that manipulates and transforms data represented as physical and/or electronic quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

What is claimed is:

1. A magnetic resonance imaging (MRI) radio frequency (RF) coil, the MRI RF coil comprising:
a first end structure and a second end structure; and
a plurality of rungs elongated from the first end structure to the second end structure to form a plurality of meshes in a first row, wherein each mesh comprises a pair of adjacent rungs of the plurality of rungs and portions of the first and second end structures connecting the pair of adjacent rungs, wherein the plurality of meshes comprise a plurality of driving meshes forming transmit channels of the MRI RF coil and further comprise a plurality of non-driving meshes, and wherein each non-driving mesh of the plurality of non-driving meshes is between and borders a pair of driving meshes of the plurality of driving meshes;
wherein the MRI RF coil has a total number of transmit channels in the first row equal to half a total number of rungs in the first row, and wherein the MRI RF coil is a degenerate birdcage coil (DBC) or a ladder coil.

2. The MRI RF coil of claim 1, further comprising:
a plurality of feed boards respectively on the plurality of driving meshes, wherein the MRI RF coil has a total number of feed boards equal to half the total number of rungs in the first row.

3. The MRI RF coil of claim 1, wherein the plurality of driving meshes and the plurality of non-driving meshes form receive channels of the MRI RF coil, and wherein the MRI RF coil has a total number of receive channels equal to a total number of meshes in the first row.

4. The MRI RF coil of claim 1, wherein the plurality of driving meshes share a first size, and wherein the plurality of non-driving meshes share a second size different than the first size.

5. The MRI RF coil of claim 1, wherein the MRI RF coil is the DBC, and wherein a total number of driving meshes in the first row is equal to a total number of non-driving meshes in the first row.

6. The MRI RF coil of claim 1, wherein the MRI RF coil is the ladder coil, wherein a total number of driving meshes in the first row is equal to half the total number of rungs in the first row, and wherein a total number of non-driving meshes in the first row is equal to one less than the total number of driving meshes in the first row.

7. The MRI RF coil of claim 1, further comprising:
a third end structure and a fourth end structure; and
a plurality of additional rungs elongated from the third end structure to the fourth end structure to form a plurality of additional meshes in a second row, which overlaps with the first row, wherein the plurality of additional meshes comprise driving meshes and non-driving meshes.

8. The MRI RF coil of claim 7, further comprising:
a plurality of splitters, each electrically coupled to a driving mesh in the first row and a driving mesh in the second row, wherein the MRI RF coil has a total number of splitters equal to half the total number of rungs in the first row.

9. The MRI RF coil according to claim 1, further comprising:
a plurality of feed boards on the first end structure and/or the second end structure, spaced from the plurality of rungs.

10. The MRI RF coil according to claim 9, wherein the plurality of feed boards correspond to external coupling points for the MRI RF coil, and wherein the plurality of non-driving meshes are devoid of external coupling points.

11. A magnetic resonance imaging (MRI) system, comprising:
a radio frequency (RF) coil that is a ladder RF coil, wherein the RF coil comprises:
a first end structure and a second end structure; and
a plurality of rungs elongated in parallel from the first end structure to the second end structure to form a plurality of meshes in a first row, wherein the plurality of meshes comprise a plurality of driving meshes and a plurality of non-driving meshes, each non-driving mesh of the plurality of non-driving meshes being between and bordering a pair of driving meshes of the plurality of driving meshes; and
a driver system comprising one or more drivers, wherein only the plurality of driving meshes amongst the plurality of meshes are electrically coupled to the driver system;
wherein a total number of driving meshes in the first row is equal to half the total number of rungs in the first row, and wherein a total number of non-driving meshes in the first row is equal to one less than the total number of driving meshes in the first row.

12. The MRI system of claim 11, wherein the one or more drivers comprise a plurality of drivers electrically coupled respectively to the plurality of driving meshes, and wherein a total number of drivers electrically coupled to the RF coil is equal to half a total number of rungs of the RF coil.

13. The MRI system of claim 11, wherein the one or more drivers has only a single driver, and wherein the MRI system comprises:
power splitters and phase shifters configured to split an input channel electrically coupled to the single driver into a plurality of output channels, which total a number equal to half a total number of rungs of the RF coil and which are electrically coupled respectively to the plurality of driving meshes.

14. The MRI system of claim 11, further comprising:
a plurality of transmit/receive (T/R) switches electrically coupled respectively to the plurality of meshes, wherein the one or more drivers are electrically coupled to the plurality of driving meshes via corresponding ones of the plurality of T/R switches.

15. The MRI system of claim 9, wherein the RF coil further comprises:

a third end structure and a fourth end structure; and a plurality of additional rungs elongated in parallel from the third end structure to the fourth end structure to form a plurality of additional meshes in a second row, wherein the plurality of additional meshes comprise a plurality of driving meshes and a plurality of non-driving meshes, and wherein only driving meshes amongst the plurality of additional meshes are electrically coupled to drivers.

16. The MRI system of claim 15, wherein the second row partially overlaps with the first row.

17. A method for magnetic resonance imaging (MRI), comprising:

providing a radio frequency (RF) coil, which is a degenerate birdcage RF coil or a ladder RF coil, wherein the RF coil comprises a plurality of rungs coupled to form at least one row of meshes, the meshes comprising non-driving meshes and driving meshes, each non-driving mesh coupled between a pair of neighboring driving meshes; and performing MRI on a scan target to generate an image of the scan target at a working frequency, wherein the performing comprises driving, via one or more drivers, the driving meshes only to transmit RF pulses into the scan target;

wherein the at least one row of meshes comprises a first row and a second row, and wherein the driving drives driving meshes in the first and second rows without driving non-driving meshes in the first and second rows.

18. The method of claim 17, further comprising:

switching, via transmit/receive switches coupled to the driving meshes and the non-driving meshes, between a transmit mode and a receive mode.

19. The method of claim 17, wherein the RF coil is the degenerate birdcage RF coil, and wherein the driving drives only half of a total number of meshes in the first row.

20. The method of claim 17, wherein the RF coil is the ladder RF coil, and wherein the driving only drives a number of meshes equal to half of a total number of rungs in the first row.

\* \* \* \* \*